United States Patent
Cesaretti

(10) Patent No.: US 10,254,354 B2
(45) Date of Patent: Apr. 9, 2019

(54) ELECTRONIC CIRCUIT FOR COMPENSATING A SENSITIVITY DRIFT OF A HALL EFFECT ELEMENT DUE TO STRESS

(71) Applicant: Allegro MicroSystems, LLC, Manchester, NH (US)

(72) Inventor: Juan Manuel Cesaretti, Ciudad de Buenos Aires (AR)

(73) Assignee: Allegro MicroSystems, LLC, Manchester, NH (US)

( * ) Notice: Subject to any disclaimer, the term of this patent is extended or adjusted under 35 U.S.C. 154(b) by 0 days.

(21) Appl. No.: 16/132,653

(22) Filed: Sep. 17, 2018

(65) Prior Publication Data
US 2019/0018074 A1    Jan. 17, 2019

Related U.S. Application Data

(63) Continuation of application No. 15/066,331, filed on Mar. 10, 2016, now Pat. No. 10,107,873.

(51) Int. Cl.
*H01L 27/22* (2006.01)
*G01R 33/00* (2006.01)
(Continued)

(52) U.S. Cl.
CPC ........ *G01R 33/0082* (2013.01); *G01L 1/2262* (2013.01); *G01R 27/08* (2013.01);
(Continued)

(58) Field of Classification Search
CPC .... G01R 33/0082; G01R 33/07; G01R 27/08; G01R 33/093; H01L 27/22; H01L 28/20;
(Continued)

(56) References Cited

U.S. PATENT DOCUMENTS

| | | | | |
|---|---|---|---|---|
| 4,236,832 A | * | 12/1980 | Komatsu | ............ H01L 23/3107 257/420 |
| 4,345,477 A | | 8/1982 | Johnson | |

(Continued)

FOREIGN PATENT DOCUMENTS

| | | |
|---|---|---|
| CN | 1501093 A | 6/2004 |
| CN | 101023367 A | 8/2007 |

(Continued)

OTHER PUBLICATIONS

PCT International Preliminary Report on Patentability dated Sep. 20, 2018, for Application No. PCT/US2017/020066; 8 Pages.

(Continued)

*Primary Examiner* — Viet Q Nguyen
(74) *Attorney, Agent, or Firm* — Daly, Crowley, Mofford & Durkee, LLP

(57) ABSTRACT

The present disclosure is directed to an electronic circuit having a Hall effect element and a resistor bridge, all disposed over a common semiconductor substrate. The resistor bridge includes a first set of resistive elements having a first vertical epitaxial resistor and a first lateral epitaxial resistor coupled in series, and a second set of resistive elements having a second vertical epitaxial resistor and a second lateral epitaxial resistor coupled in series. The first set of resistive elements and the second set of resistive elements can be coupled in parallel. The resistor bridge can be configured to sense a stress value of the Hall effect element.

23 Claims, 6 Drawing Sheets

(51) Int. Cl.
  *G01R 33/07* (2006.01)
  *H01L 49/02* (2006.01)
  *H01L 43/04* (2006.01)
  *H01L 43/06* (2006.01)
  *G01L 1/22* (2006.01)
  *G01R 27/08* (2006.01)
  *H01L 21/02* (2006.01)
  *G01R 33/09* (2006.01)

(52) U.S. Cl.
  CPC ............ *G01R 33/07* (2013.01); *G01R 33/093* (2013.01); *H01L 21/02697* (2013.01); *H01L 27/22* (2013.01); *H01L 28/20* (2013.01); *H01L 43/04* (2013.01); *H01L 43/065* (2013.01)

(58) Field of Classification Search
  CPC . H01L 43/04; H01L 43/065; H01L 21/02697; G01L 1/2262
  USPC .......................................................... 257/427
  See application file for complete search history.

(56) References Cited

U.S. PATENT DOCUMENTS

| | | | |
|---|---|---|---|
| 4,430,895 A * | 2/1984 | Colton | G01P 15/0802 338/43 |
| 4,438,347 A * | 3/1984 | Gehring | H01C 17/23 257/734 |
| 4,703,663 A | 11/1987 | Oppermann | |
| 4,752,733 A | 6/1988 | Petr et al. | |
| 4,758,943 A | 7/1988 | Åström et al. | |
| 4,760,285 A | 7/1988 | Nelson | |
| 4,823,075 A | 4/1989 | Alley | |
| 4,833,406 A | 5/1989 | Foster | |
| 4,965,762 A | 10/1990 | Williams | |
| 4,970,411 A | 11/1990 | Halg et al. | |
| 4,987,781 A * | 1/1991 | Reimann | G01P 15/123 257/417 |
| 5,135,062 A | 8/1992 | Lockery et al. | |
| 5,247,278 A | 9/1993 | Pant et al. | |
| 5,329,416 A | 7/1994 | Ushiyama et al. | |
| 5,343,143 A | 8/1994 | Voisine et al. | |
| 5,412,255 A | 5/1995 | Wallrafen | |
| 5,424,558 A | 6/1995 | Borden et al. | |
| 5,469,058 A | 11/1995 | Dunnam | |
| 5,521,501 A | 5/1996 | Dettmann et al. | |
| 5,614,754 A | 3/1997 | Inoue | |
| 5,621,319 A | 4/1997 | Bilotti et al. | |
| 5,640,090 A | 6/1997 | Furuya et al. | |
| 5,652,445 A | 7/1997 | Johnson | |
| 5,734,703 A | 3/1998 | Hiyoshi | |
| 5,844,140 A | 12/1998 | Seale | |
| 6,011,770 A | 1/2000 | Tan | |
| 6,023,978 A | 2/2000 | Dauenhauer et al. | |
| 6,351,506 B1 | 2/2002 | Lewicki | |
| 6,362,618 B1 | 3/2002 | Motz | |
| 6,392,478 B1 | 5/2002 | Mulder et al. | |
| 6,436,748 B1 | 8/2002 | Forbes et al. | |
| 6,437,558 B2 | 8/2002 | Li et al. | |
| 6,441,460 B1 | 8/2002 | Viebach | |
| 6,639,290 B1 | 10/2003 | Hohe et al. | |
| 6,750,644 B1 | 6/2004 | Berkcan | |
| 6,853,178 B2 | 2/2005 | Hayat-Dawoodi | |
| 6,896,407 B2 | 2/2005 | Nomiyama et al. | |
| 6,917,321 B1 | 7/2005 | Haurie et al. | |
| 6,973,836 B2 | 12/2005 | Katsumata et al. | |
| 6,991,367 B2 | 1/2006 | Adlerstein | |
| 7,038,448 B2 | 5/2006 | Schott et al. | |
| 7,190,784 B2 | 3/2007 | Li | |
| 7,259,545 B2 | 8/2007 | Stauth et al. | |
| 7,292,095 B2 | 11/2007 | Burt et al. | |
| 7,319,319 B2 | 1/2008 | Jones et al. | |
| 7,323,870 B2 | 1/2008 | Tatschl et al. | |
| 7,325,175 B2 | 1/2008 | Momtaz | |
| 7,339,245 B2 | 3/2008 | Mueller | |
| 7,345,470 B2 | 3/2008 | Suzuki | |
| 7,425,821 B2 | 9/2008 | Monreal et al. | |
| 7,474,093 B2 | 1/2009 | Ausserlechner | |
| 7,518,354 B2 | 4/2009 | Stauth et al. | |
| 7,598,601 B2 | 10/2009 | Taylor et al. | |
| 7,605,647 B1 | 10/2009 | Romero et al. | |
| 7,635,993 B2 | 12/2009 | Boeve | |
| 7,694,200 B2 | 4/2010 | Forrest et al. | |
| 7,701,208 B2 | 4/2010 | Nishikawa | |
| 7,729,675 B2 | 6/2010 | Krone | |
| 7,746,056 B2 | 6/2010 | Stauth et al. | |
| 7,746,065 B2 | 6/2010 | Pastre et al. | |
| 7,764,118 B2 | 7/2010 | Kusuda et al. | |
| 7,769,110 B2 | 8/2010 | Momtaz | |
| 7,800,389 B2 | 9/2010 | Friedrich et al. | |
| 7,872,322 B2 | 1/2011 | Schott et al. | |
| 7,923,996 B2 | 4/2011 | Doogue et al. | |
| 7,936,029 B2 | 5/2011 | Wang | |
| 7,936,144 B2 | 5/2011 | Vig et al. | |
| 7,961,823 B2 | 6/2011 | Kolze et al. | |
| 7,980,138 B2 | 7/2011 | Ausserlechner | |
| 7,990,209 B2 | 8/2011 | Romero | |
| 8,030,918 B2 | 10/2011 | Doogue et al. | |
| 8,128,549 B2 | 3/2012 | Testani et al. | |
| 8,134,358 B2 | 3/2012 | Charlier et al. | |
| 8,203,102 B2 | 6/2012 | Nakano et al. | |
| 8,203,329 B2 | 6/2012 | Hohe et al. | |
| 8,215,177 B2 | 7/2012 | Hayner et al. | |
| 8,357,983 B1 | 1/2013 | Wang | |
| 8,447,556 B2 | 5/2013 | Friedrich et al. | |
| 8,616,065 B2 | 12/2013 | Stewart et al. | |
| 8,618,821 B2 | 12/2013 | Fornara et al. | |
| 8,692,546 B2 | 4/2014 | Cesaretti et al. | |
| 8,723,515 B2 * | 5/2014 | Motz | G01R 33/0029 324/251 |
| 8,818,749 B2 | 8/2014 | Friedrich et al. | |
| 9,003,897 B2 | 4/2015 | Wade et al. | |
| 9,121,896 B2 | 9/2015 | Fornara et al. | |
| 9,312,473 B2 | 4/2016 | Kosier et al. | |
| 9,322,840 B2 | 4/2016 | Ausserlechner | |
| 9,638,764 B2 * | 5/2017 | Cesaretti | G01R 33/0023 |
| 9,753,097 B2 | 9/2017 | Romero | |
| 9,766,300 B2 * | 9/2017 | Motz | G01R 33/0029 |
| 9,851,417 B2 | 12/2017 | Kosier et al. | |
| 9,857,437 B2 | 1/2018 | Taylor et al. | |
| 9,929,141 B2 | 3/2018 | Kuo et al. | |
| 10,107,873 B2 * | 10/2018 | Cesaretti | G01R 33/0082 |
| 10,162,017 B2 * | 12/2018 | Cesaretti | G01R 33/0029 |
| 2002/0084923 A1 | 7/2002 | Li | |
| 2002/0100948 A1 | 8/2002 | Yoshihara et al. | |
| 2003/0038675 A1 | 2/2003 | Gailus et al. | |
| 2003/0102909 A1 | 6/2003 | Motz | |
| 2004/0032246 A1 | 2/2004 | Motz | |
| 2005/0265898 A1 | 12/2005 | Bell et al. | |
| 2006/0202692 A1 | 9/2006 | Tatschl et al. | |
| 2007/0018655 A1 | 1/2007 | Ausserlechner et al. | |
| 2007/0110199 A1 | 5/2007 | Momtaz et al. | |
| 2007/0222433 A1 | 9/2007 | Tiernan et al. | |
| 2007/0247141 A1 | 10/2007 | Pastre et al. | |
| 2007/0263700 A1 | 11/2007 | Moelkner et al. | |
| 2007/0265898 A1 | 11/2007 | Naono et al. | |
| 2007/0285089 A1 | 12/2007 | Ibuki et al. | |
| 2008/0094055 A1 | 4/2008 | Monreal et al. | |
| 2008/0110987 A1 | 5/2008 | Cato et al. | |
| 2008/0137784 A1 | 6/2008 | Krone | |
| 2008/0238410 A1 | 10/2008 | Charlier et al. | |
| 2008/0265880 A1 | 10/2008 | Nishikawa | |
| 2009/0001964 A1 | 1/2009 | Strzalkowski et al. | |
| 2009/0001972 A1 | 1/2009 | Fernandez et al. | |
| 2009/0029668 A1 | 1/2009 | Hsieh et al. | |
| 2009/0085706 A1 | 4/2009 | Baarman et al. | |
| 2009/0108839 A1 | 4/2009 | Ausserlechner | |
| 2009/0212765 A1 | 8/2009 | Doogue et al. | |
| 2009/0256559 A1 | 10/2009 | Ausserlechner et al. | |
| 2010/0045362 A1 | 2/2010 | Dribinsky et al. | |
| 2010/0117638 A1 | 5/2010 | Yamashita et al. | |
| 2010/0117715 A1 | 5/2010 | Ariyama | |

(56) References Cited

U.S. PATENT DOCUMENTS

| | | |
|---|---|---|
| 2010/0211347 A1 | 8/2010 | Friedrich et al. |
| 2010/0315108 A1 | 12/2010 | Fornara et al. |
| 2011/0018533 A1 | 1/2011 | Cesaretti et al. |
| 2011/0048102 A1 | 3/2011 | Fernandez et al. |
| 2011/0080933 A1 | 4/2011 | Rivero |
| 2011/0298448 A1 | 12/2011 | Foletto et al. |
| 2011/0298453 A1 | 12/2011 | Kura et al. |
| 2012/0016614 A1 | 1/2012 | Hohe et al. |
| 2012/0112695 A1 | 5/2012 | Nishi et al. |
| 2012/0274314 A1 | 11/2012 | Cesaretti et al. |
| 2012/0313635 A1 | 12/2012 | Daubert |
| 2013/0057084 A1 | 3/2013 | Lee |
| 2013/0093412 A1 | 4/2013 | Anelli et al. |
| 2013/0285651 A1 | 10/2013 | Wan et al. |
| 2014/0009221 A1* | 1/2014 | Motz ............... G01R 33/0029 327/564 |
| 2015/0028871 A1 | 1/2015 | Suijver et al. |
| 2015/0115937 A1 | 4/2015 | Fujita et al. |
| 2015/0316623 A1 | 11/2015 | Romero |
| 2016/0241186 A1* | 8/2016 | Motz ....................... G01D 3/02 |
| 2017/0261306 A1 | 9/2017 | Ausserlechner |
| 2017/0261567 A1 | 9/2017 | Cesaretti |
| 2017/0331429 A1* | 11/2017 | Motz ....................... H03B 5/04 |
| 2018/0026609 A1 | 1/2018 | Scilla |

FOREIGN PATENT DOCUMENTS

| | | |
|---|---|---|
| CN | 200986484 Y | 12/2007 |
| CN | 1714458 A | 12/2008 |
| DE | 195 39 458 A1 | 4/1997 |
| DE | 196 06 826 A1 | 8/1997 |
| DE | 10 2005 047 413 A1 | 9/2006 |
| DE | 10 2006 037 226 A | 2/2008 |
| DE | 10 2007 041 230 B3 | 4/2009 |
| EP | 0 289 414 A2 | 11/1988 |
| EP | 0 338 122 | 10/1989 |
| EP | 0 357 013 A2 | 3/1990 |
| EP | 0 357 013 A3 | 3/1990 |
| EP | 1 637 898 A1 | 3/2006 |
| EP | 1 679 524 A1 | 7/2006 |
| EP | 1 850 143 A1 | 10/2007 |
| EP | 2 339 735 | 6/2011 |
| GB | 2 276 727 A | 10/1994 |
| JP | S 6148777 A | 3/1986 |
| JP | SHO 61-48777 | 3/1986 |
| JP | H03-176682 | 7/1991 |
| JP | H03-248611 A | 11/1991 |
| JP | 2000-55999 A | 2/2000 |
| JP | 2002-213992 | 7/2002 |
| JP | 2004-177228 A | 6/2004 |
| JP | 2004-234589 A | 8/2004 |
| JP | 2006-123012 A | 5/2006 |
| JP | 2008-513762 A | 5/2008 |
| JP | 2010-500536 A | 1/2010 |
| JP | 4840481 B2 | 1/2011 |
| JP | 2011-052036 A | 3/2011 |
| KR | 10-2007-0060096 A | 6/2007 |
| TW | 200640135 | 11/2006 |
| WO | WO 96/02849 A1 | 2/1996 |
| WO | WO 2004/072672 | 8/2004 |
| WO | WO 2006/035342 A1 | 4/2006 |
| WO | WO 2006/056829 | 6/2006 |
| WO | WO 2007/138508 A1 | 12/2007 |
| WO | WO 2008/048379 A1 | 4/2008 |
| WO | WO 2008/123144 A1 | 10/2008 |
| WO | WO 2009/108422 A2 | 9/2009 |
| WO | WO 2009/108422 A3 | 9/2009 |
| WO | WO 2010/096367 A1 | 8/2010 |
| WO | WO 2011/011479 | 1/2011 |
| WO | WO 2012/013977 A1 | 2/2012 |

OTHER PUBLICATIONS

U.S. Appl. No. 15/207,903, filed Jul. 12, 2016, Cesaretti.

Kanda, Yozo; "A Graphical Representation of the Piezoresistance Coefficients in Silicon;" IEEE Transactions on Electron Devices, vol. ed-29, No. 1; Jan. 1982; pp. 64-70 (7 pages).

Kanda, Yozo; "The Piezo-Hall Effect in n-Silicon;" Department of Electrical & Electronic Engineering, Toyo University, Jan. 1995; pp. 89-92 (4 pages).

Motz, et al.; "A Miniature Digital Current Sensor With Differential Hall Probes Using Enhanced Chopping Techniques and Mechanical Stress Compensation;" 2012 IEEE Sensors; Oct. 28-31, 2012; 4 pages.

Allegro MicroSystems, LLC; A3981 Automotive, Programmable Stepper Driver; datasheet; Jan. 2013; 43 pages.

Ausserlechner et al.; "Compensation of the Piezo-Hall Effect in Integrated Hall Sensors on (100)-Si;" IEEE Sensors Journal, vol. 7, No. 11; Nov. 2007; ISBN: 1530-437X; pp. 1475-1482.

Ausserlechner et al.; "Drift of Magnetic Sensitivity of Small Hall Sensors Due to Moisture Absorbed by the IC-Package;" Proceedings of IEEE Sensors, 2004; vol. 1; Oct. 24, 2004; ISBN:0-7803-8692-2; pp. 455-458.

Ausserlechner; "Limits of Offset Cancellation by the Principle of Spinning Current Hall Probe;" Proceedings of IEEE Sensors; Oct. 2004; pp. 1117-1120.

Ausserlechner; "The piezo-Hall effect in n-silicon for arbitrary crystal orientation;" Proceedings of IEEE Sensors; vol. 3; Oct. 24, 2004; ISBN: 0-7803-8692-2; pp. 1149-1152.

Bahreyni, et al.; "A Resonant Micromachined Magnetic Field Sensor;" IEEE Sensors Journal; vol. 7, No. 9, Sep. 2007; pp. 1326-1334.

Barrettino, et al.; "CMOS-Based Monolithic Controllers for Smart Sensors Comprising Micromembranes and Microcantilevers;" IEEE Transactions on Circuits and Systems-I Regular Papers vol. 54, No. 1; Jan. 2007; pp. 141-152.

Baschirotto et al.; "Development and Analysis of PCB Vector 2-D Magnetic Field Sensor System for Electronic Compass;" IEEE Sensors Journal vol. 6, No. 2; Apr. 2006; pp. 365-371.

Bilotti et al.; "Monolithic Magnetic Hall Sensor Using Dynamic Quadrature Offset Cancellation;" IEEE Journal of Solid-State Circuits; vol. 32, Issue 6; Jun. 1997; pp. 829-836.

Blagojevic et al.; "FD SOI Hall Sensor Electronics Interfaces for Energy Measurement;" Microelectronics Journal 37; Sep. 2006; pp. 1576-1583.

Cesaretti et al.; "Effect of Stress Due to Plastic Package Moisture Absorption in Hall Sensors;" IEEE Transactions on Magnets; vol. 45; No. 10; Oct. 2009; pp. 4482-4485.

Demierre, et al.; "Reference Magnetic Actuator for Self-Calibration of a Very Small Hall Sensor Array;" Sensors and Actuators A97-98; Apr. 2002; pp. 39-46.

Frick, et al.; "CMOS Microsystem for AC Current Measurement with Galvanic Isolation;" IEEE Sensors Journal; vol. 3, No. 6; Dec. 2003; pp. 752-760.

Halg; "Piezo-Hall Coefficients of n-Type Silicon;" Journal of Applied Physics; vol. 64, No. 1; Jul. 1, 1988; pp. 276-282.

Hosticka; "CMOS Sensor Systems;" Sensors and Actuators A66; Apr. 1998; pp. 335-341.

Kanda et al.; "The Piezo-Hall Effect in n-Silicon;" 22nd International Conference on the Physics of Semiconductors; vol. 1, Jan. 1995; pp. 89-92.

Kayal et al.; "Automatic Calibration of Hall Sensor Microsystems;" Microelectronics Journal 37; Sep. 2006; pp. 1569-1575.

Krammerer et al.: "A Hall effect sensors network insensitive to mechanical stress;" Proceedings of IEEE Sensors; vol. 3, Oct. 2004; pp. 1071-1074.

Mangnani et al.; "Mechanical Stress Measurement Electronics Based on Piezo-Resistive and Piezo-Hall Effects;" 9th International Conference on Electronics, Circuits and Systems 2002; vol. 1; SBN: 0-7803-7596-3; Dec. 2002; pp. 363-366.

Manic et al.; "Short and Long-Term Stability Problems of Hall Plates in Plastic Packages;" IEEE 38th Annual International Reliability Physics Symposium; Apr. 2000; pp. 225-230.

Manic; "Drift in Silicon Integrated Sensors and Circuits Due to the Thermo-Mechanical Stresses;" Lausanne, École Polytechnique Fédérale De Lausanne 2000; 176 pages.

(56) References Cited

OTHER PUBLICATIONS

Motz et al.; "An Integrated Magnetic Sensor with Two Continuous-Time ΔΣ-Converters and Stress Compensation Capability;" IEEE International Solid-State Circuits Conference; Digest of Technical Papers; Feb. 6, 2006; ISBN: 1-4244-0079-1; pp. 1151-1160.

Motz, et al.; "A Chopped Hall Sensor with Small Jitter and Programmable "True Power-On" Function;" IEEE Journal of Solid-State Circuits; vol. 40, No. 7; Jul. 2005; pp. 1533-1540.

Motz, et al.; "An Integrated Hall Sensor Platform Design for Position, Angle and Current Sensing;" IEEE Sensors 2006; Exco, Daegu, Korea / Oct. 22-25, 2006; pp. 1008-1011.

Munter; "A Low-offset Spinning-current Hall Plate;" Sensors and Actuators A21-A23; 1990; pp. 742-746.

Munter; "Electronic Circuitry for a Smart Spinning-current Hall Plate with Low Offset;" Sensors and Actuators A; Jun. 1991; pp. 747-751.

Partin et al.; "Temperature Stable Hall Effect Sensors;" IEEE Sensors Journal, vol. 6, No. 1; Feb. 2006; pp. 106-110.

Pastre, et al.; "A Hall Sensor Analog Front End for Current Measurement with Continuous Gain Calibration;" IEEE Sensors Journal; vol. 7, No. 5; May 2007; pp. 860-867.

Pastre, et al.; "A Hall Sensor-Based Current Measurement Microsystem With Continuous Gain Calibration;" Research in Microelectronics and Electronics, IEEE vol. 2; Jul. 25, 2005; ISBN: 0-7803-9345-7; pp. 95-98.

Popovic; "Sensor Microsystems;" Proc. 20$^{th}$ International Conference on Microelectronics (MWIL 95); vol. 2, NIS, Serbia, Sep. 12-14, 1995; pp. 531-537.

Randhawa; "Monolithic Integrated Hall Devices in Silicon Circuits;" Microelectronics Journal; vol. 12, No. 6; Sep. 14-17, 1981; pp. 24-29.

Ruther et al.; "Integrated CMOS-Based Sensor Array for Mechanical Stress Mapping;" 5$^{th}$ IEEE Conference on Sensors, Oct. 2006; pp. 1131-1134.

Ruther et al.; "Thermomagnetic Residual Offset in Integrated Hall Plates;" IEEE Sensors Journal; vol. 3, No. 6; Dec. 2003; pp. 693-699.

Sargent; "Switched-capacitor IC controls feedback loop;" EDN; Design Ideas; Feb. 17, 2000; pp. 154 and 156.

Schneider, et al.; "Temperature Calibration of CMOS Magnetic Vector Probe for Contactless Angle Measurement System;" IEDM; Dec. 1996; pp. 533-536.

Schott et al.; "Linearizing Integrated Hall Devices;" 1997 International Conference on Solid-State Sensors and Actuators, Jun. 16-19, 1997; pp. 393-396.

Schott, et al.; "CMOS Single-Chip Electronic Compass with Microcontroller;" IEEE Journal of Solid-State Circuits; vol. 42, No. 12; Dec. 2007; pp. 2923-2933.

Simon et al.; "Autocalibration of Silicon Hall Devices;" 8$^{th}$ International Conference on Solid-State Sensors and Actuators; vol. 2; Jun. 25, 1995; pp. 237-240.

Steiner et al; Offset Reduction in Hall Devices by Continuous Spinning Current Method; Sensors and Actuators A66; 1998; pp. 167-172.

Steiner: "Double-Hall Sensor with Self-Compensated Offset;" Electron Devices Meeting; IDSM '97 Technical Digest; Dec. 7-10, 1997; pp. 911-914.

Stellrecht et al.; Characterization of Hygroscopic Swelling Behavior of Mold Compounds and Plastic Packages; IEEE Transactions on Components and Packaging Technologies; vol. 27, No. 3; Sep. 2004; pp. 499-506.

Tian et al.; "Multiple Sensors on Pulsed Eddy-Current Detection for 3-D Subsurface Crack Assessment;" IEEE Sensors Journal, vol. 5, No. 1; Feb. 2005; pp. 90-96.

Trontelj et al; "CMOS Integrated Magnetic Field Source Used as a Reference in Magnetic Field Sensors on Common Substrate;" WEP 1-6; IMTC; May 1994; pp. 461-463.

Wu, et al.; "A Chopper Current-Feedback Instrumentation Amplifier with a 1mHz 1/f Noise Corner and an AC-Coupled Ripple-Reduction Loop;" IEEE International Solid-State Circuits Conference; Feb. 10, 2009; pp. 322-324.

Zou et al.; "Three-Dimensional Die Surface Stress Measurements in Delaminated and Non-Delaminated Plastic Packages;" 48th Electronic Components and Technology Conference; May 25, 1998; 12 Pages.

Chinese Office Action with English dated Aug. 29, 2012; for Chinese Pat. App. No. 200980106535.4; 8 pages.

Letter from NTD Patent & Trademark Agency Limited; dated Oct. 10, 2012; for Chinese Pat. App. No. 200980106535.4; 13 pages.

Letter to NTD Patent and Trademark Agency Ltd. dated Dec. 11, 2012 with instructions to file Response to Official Action for Chinese App. No. 200980106535.4; 3 pages.

Letter from NTD Patent and Trademark Agency Ltd.; dated Jan. 19, 2013; enclosing Response to Official Action; for Chinese Pat. App. No. 200980106535.4; 14 pages.

Chinese Office Action dated Apr. 15, 2013 (with English translation); for CN Pat. App. No. 200980106535.4 4 pages.

Letter to NTD Patent and Trademark Agency; dated Jun. 19, 2013; for Chinese Pat. App. No. 200980106535.4; 11 pages.

Chinese Response to Office Action; dated Jul. 11, 2013; for Chinese Pat. App. No. 200980106535.4; 12 pages.

Letter from NTD Patent and Trademark Agency; dated Jul. 11, 2013; for Chinese Pat. App. No. 200980106535.4; 1 page.

Chinese Office Action dated Nov. 7, 2013 (w/English translation); for Chinese Pat. App. No. 200980106535.4; 9 pages.

Claims from Chinese Office Action dated Nov. 7, 2013 (w/English translation); for Chinese Pat. App. No. 200980106535.4; 8 pages.

Letter to NTD Patent and Trademark Agency, Ltd. dated Dec. 16, 2013; for Chinese Pat. App. No. 200980106535.4; 10 pages.

Letter from NTD Patent and Trademark Agency, Ltd. dated Jan. 7, 2014; for Chinese Pat. App. No. 200980106535.4; 1 page.

Response to Office Action dated Jan. 7, 2014; for Chinese Pat. App. No. 200980106535.4; 10 pages.

Chinese Notice of Completing Formalities (including English translation) and Search Report dated Mar. 7, 2014; for Chinese Pat. App. No. 200980106535.4; 8 pages.

Japanese Notice of Reasons for Rejection (English translation); dated Apr. 4, 2013; for JP Pat. App. No. 2010-547666; 4 pages.

Letter from Yuasa & Hara dated May 27, 2013 for JP Appln. No. 2010-547666; 2 pages.

Argument and Amendment (in Japanese); dated Jul. 3, 2013; for Japanese Pat. App. No. 2010-547666; 6 pages.

Claims for Argument and Amendment (in English); dated Jul. 3, 2013; for Japanese Pat. App. No. 2010-547666; 5 pages.

Letter from Yuasa and Hara; dated Oct. 8, 2013; for Japanese Pat. App. No. 2010-547666; 2 pages.

Japanese Notice of Reasons for Rejection (English translation) dated Nov. 28, 2013; for JP Pat. App. No. 2010-547666; 2 pages.

Japanese Notice of Reasons for Rejection dated Sep. 29, 2014; for Japanese Pat. App. No. 2010-547666; 4 pages.

Letter to Yuasa and Hara dated Jan. 9, 2015; for Japanese Pat. App. No. 2010-547666; 6 pages.

Claims filed Jan. 27, 2015 in Response to Japanese Office Action; for Japanese Pat. App. No. 2010-547666; 5 pages.

Korean Notice to Submit a Response (with English translation) dated Sep. 30, 2014; for Korean Pat. App. No. 10-2010-7019498; 10 pages.

Letter to 21st Century Patent & Law Firm dated Nov. 18, 2014; for Korean Pat. App. No. 10-2010-7019498; 36 pages.

Korean Response to Notice of Reasons for Refusal dated Dec. 1, 2014; for Korean Pat. App. No. 10-2010-7019498; 31 pages.

Korean Notice to Submit a Response dated Jan. 30, 2015; for Korean Pat. App. No. 10-2014-7033792; 6 pages.

Letter to 21st Century Patent & Law Firm dated Mar. 10, 2015; for Korean Pat. App. No. 10-2014-7033792; 2 pages.

Korean Response to Notice of Reasons for Refusal dated Mar. 23, 2015; for Korean Pat. App. No. 10-2014-7033792; 11 page.

Letter from 21st Century Patent & Law Firm dated Mar. 23, 2015; for Korean Pat. App. No. 10-2014-7033792; 1 page.

PCT Search Report and Written Opinion of the ISA for PCT/US2009/031776 dated Oct. 23, 2009.

(56) References Cited

OTHER PUBLICATIONS

PCT International Preliminary Report on Patentability and Written Opinion dated Sep. 10, 2010 for PCT/US2009/031776.
PCT Search Report and Written Opinion of the ISA dated Dec. 14, 2012; for PCT Pat. App. No. PCT/US2012/046635; 14 pages.
Schweda et al.; "A Nonlinear Simulation Model for Integrated Hall Devices in CMOS Silicon Technology;" Proceedings of 2002 IEEE International Behavioral Modeling and Simulation, BMAS 2002; Oct. 6-8, 2002; pp. 1-7.
Japanese Allowed Claims dated May 25, 2015; for Japanese Pat. App. No. 2010-547666; 5 pages.
Korean Notice of Allowance with Allowed Claims (English Translation); dated Apr. 20, 2015; for Korean Pat. App. No. 10-2010-7019498; 12 pages.
Ackermann et al.; "New Generation of Hall-effect Based Current Sensor: Evolution from Core-based to Integrated;" M. Sc. Laurent Coulot, Melexis Technologies, A.G.Bevaix; Apr. 1, 2015; 8 pages.
Huber et al.; "Package Stress Monitor to Compensate for the Piezo-Hall Effect in CMOS Hall Sensors;" 2012 IEEE Sensors; Oct. 2012; 4 pages.
Huber et al.; "Package Stress Monitor to Compensate for the Piezo-Hall Effect in CMOS Hall Sensors;" IEEE Sensors Journal, vol. 13, No. 8; Aug. 2013; pp. 2890-2898.
Kanda; "A Graphical Representation of the Piezoresistance Coefficients in Silocon;" IEEE Transactions on Electron Devices; vol. Ed-29, vol. 1; Jan. 1982; pp. 64-70.
Krammerer et al.; "A Hall Effect Sensors Network Insensitive to Mechanical Stress;" Proceedings of IEEE Sensors; Oct. 2004; 4 pages.
Motz et al.; "A Miniature Digital Current Sensor with Differential Hall Probes Using Enhanced Chopping Techniques and Mechanical Stress Compensation;" IEEE Sensors; Oct. 2012; 4 pages.
Randjelovic et al.; "Highly Sensitive Hall Magnetic Sensor Microsystems in CMOS Technology;" IEEE Journal of Solid-State Circuits, vol. 37, No. 2; Feb. 2002; pp. 151 to 159.
Steiner et al.; "Double-Hall Sensor with Self-Compensated Offset;" IEDM 97 Technical Digest, International Electron Devices Meeting; Dec. 1997; pp. 36.6.1 to 36.6.4.
Van der Meer et al; "CMOS Quad-Spinning-Current Hall-Sensor System for Compass Application;" Proceedings of IEEE Sensors, vol. 3; Oct. 2004; pp. 1434-1437.
Korean Notice of Allowance dated Jul. 31, 2015; for Korean Pat. App. No. 10-2014-7033792; 5 pages.
Letter from Yuasa and Hara dated Jan. 28, 2016 for Japanese Appln. No. JP 2015-013206; 3 pages.
Japanese Notice of Reasons for Rejection dated Jan. 4, 2016; for Japanese Pat. App. No. 2015-013206; 7 pages.
Letter from Yuasa and Hara dated Mar. 25, 2016; for Japanese Pat. App. No. 2015-013206; 1 page.
Response dated Mar. 17, 2016 with English Claims dated Mar. 17, 2016 to Japanese Office Action; for Japanese Pat. App. No. 2015-013206; 7 pages.
PCT International Search Report and Written Opinion dated Jul. 20, 2016 for International Application No. PCT/US2016/025495; 20 pages.
Non-Final Office Action dated Aug. 12, 2016; for U.S. Appl. No. 14/681,575; 45 Pages.
Response filed on Nov. 1, 2016 to Office Action dated Aug. 12, 2016 regarding U.S. Appl. No. 14/681,575; 12 pages.
Notice of Allowance dated Feb. 17, 2017 from U.S. Appl. No. 14/681,575; 13 Pages.
PCT Search Report and Written Opinion of the ISA dated May 22, 2017 from International Application No. PCT/US2017/020066; 14 Pages.
Partial European Search Report dated Dec. 19, 2017 from Application No. 17180353.9; 19 Pages.
U.S. Non-Final Office Action dated Apr. 3, 2018 for U.S. Appl. No. 15/207,903; 21 pages.
Response to U.S. Non-Final Office Action dated Apr. 3, 2018 for U.S. Appl. No. 15/207,903; Response filed on Apr. 12, 2018; 11 Pages.
Search Report and Written Opinion dated May 11, 2018 for European Application No. 17180353.9, 23 pages.
Official Communication reply dated May 9, 2018 for EP Pat. Appl. No. 16716398.9; 3 pages.
Amended to Specification filed May 9, 2018 for EP Pat. Appl. No. 16716398.9; 2 pages.
Amended to Claims filed May 9, 2018 for EP Appl. No. 16716398.9; 5 pages.
PCT International Preliminary Report dated Oct. 19, 2017 for International Application No. PCT/US2016/025495; 16 Pages.
U.S. Notice of Allowance dated Jun. 20, 2018 for U.S. Appl. No. 15/207,903; 13 Pages.
U.S. Non-Final Office Action dated Apr. 27, 2018 for U.S. Appl. No. 15/066,331; 11 Pages.
Response to U.S. Non-Final Office Action dated Apr. 27, 2018 for U.S. Appl. No. 15/066,331; Response filed Jun. 8, 2018; 10 Pages.
U.S. Notice of Allowance dated Jul. 16, 2018 for U.S. Appl. No. 15/066,331; 13 Pages.
Communication under Rule 71(3) EPC dated Sep. 14, 2018 for European Application No. 16716398.9; 7 Pages.
Allowed Specification dated Sep. 14, 2018 for European Application No. 16716398.9; 33 Pages.
Response to Written Opinion for European Application No. 17180353.9 as filed on Dec. 13, 2018; 17 Pages.

\* cited by examiner

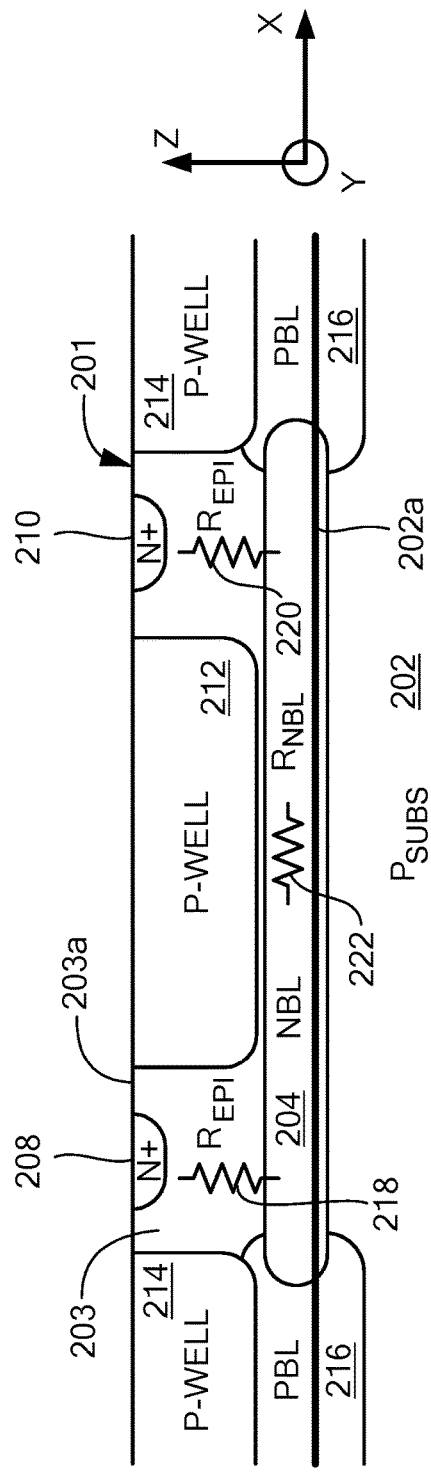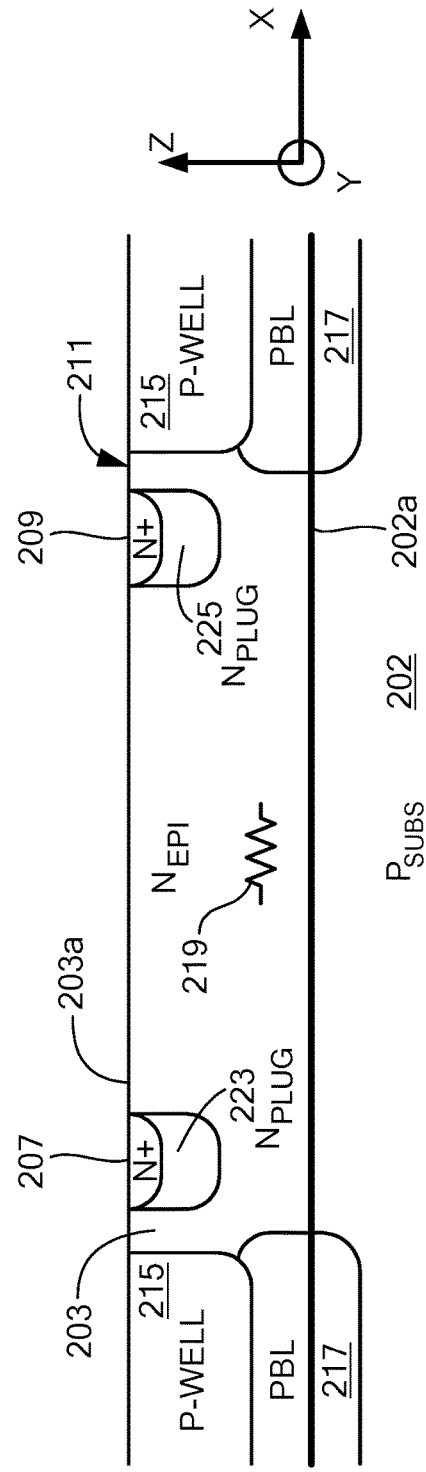

ELECTRONIC CIRCUIT FOR COMPENSATING A SENSITIVITY DRIFT OF A HALL EFFECT ELEMENT DUE TO STRESS

CROSS-REFERENCE TO RELATED APPLICATIONS

This application is a continuation of U.S. patent application Ser. No. 15/066,331 filed Mar. 10, 2016, and entitled "ELECTRONIC CIRCUIT FOR COMPENSATING A SENSITIVITY DRIFT OF A HALL EFFECT ELEMENT DUE TO STRESS," which applications are hereby incorporated herein by reference in their entirety.

FIELD OF THE INVENTION

This invention relates generally to magnetic field sensors, and, more particularly, to a magnetic field sensor having an electronic circuit for compensating for a sensitivity drift of a Hall effect element due to a stress of a substrate on which the Hall effect element and electronic circuit are disposed.

BACKGROUND

Hall effect elements are known. A typical planar or horizontal Hall effect element is a four terminal device for which a drive current (a DC current) is passed between two opposing ones of the four terminals and a differential voltage (AC or DC), responsive to a magnetic field (AC or DC), is generated between the other two opposing ones of the four terminals. An amplitude of the differential signal (i.e., voltage) is related an amplitude of the drive current. Thus, a sensitivity (e.g., mV per Gauss) of the differential signal is related to the amplitude of the drive current.

The Hall effect element can be used in current spinning or chopping arrangements in order to reduce a DC offset from the Hall effect element, which is typified by a non-zero output voltage from the Hall effect element even when experiencing a zero magnetic field. With current spinning or chopping, the terminals used to pass the drive current and the terminals used to generate the differential signal can be changed at a current spinning rate in a periodic and cyclic manner. There can be two such changes per cycle with two-phase current spinning or four such changes with four-phase current spinning.

In order to maintain a constant and stable sensitivity, the drive current can be generated with a stable current source or a current sink that uses a stable reference voltage. However, various parameters can cause the sensitivity to magnetic fields of the differential signal to change.

In general, even with a perfectly stable drive current, the Hall effect element itself can experience sensitivity changes. The changes in sensitivity of the Hall effect element can result directly from temperature changes. In order to correct for this sensitivity change, temperature can be sensed and the changes in sensitivity with temperature can be corrected.

However, the changes in sensitivity of the differential signal can also result from stresses upon a substrate on which the Hall effect element is disposed. The stresses may or may not be related to temperature and also may or may not be related to a thermal coefficient of a material of a package used to seal the substrate. The stresses and resulting changes in sensitivity may vary from unit to unit in different ways with respect to temperature.

SUMMARY

The present invention can provide an electronic circuit that can sense substrate stress and compensate for changes in sensitivity of the Hall effect element that would result from the stress.

The present disclosure is directed towards a resistor bridge circuit that is configured to sense changes in package induced stress. The resistor bridge circuit may be incorporated into an integrated circuit, such as a silicon die. The integrated circuit further includes a Hall effect element that is sensitive to temperature changes and stresses applied to the integrated circuit. The temperature changes and stresses can change a sensitivity of the Hall effect element, also known as a Hall sensitivity drift.

In one aspect, the present disclosure is directed to an electronic circuit having a semiconductor substrate and a resistor bridge disposed upon the semiconductor substrate. The resistor bridge includes a first set of resistive elements having a first vertical epitaxial resistor and a first lateral epitaxial resistor coupled in series and a second set of resistive elements having a second vertical epitaxial resistor and a second lateral epitaxial resistor coupled in series. The first set of resistive elements and the second set of resistive elements may be coupled in parallel. The resistor bridge can be operable to generate a differential signal responsive to a stress of the semiconductor substrate.

In some embodiments, the above electronic circuit can include one or more of the following aspects in any combination. In an embodiment, each resistive element of the first and second sets of resistive elements can have the same temperature coefficient. A stress coefficient of the first vertical epitaxial resistor may be equal to a stress coefficient of the second vertical epitaxial resistor. Further, a stress coefficient of the first lateral epitaxial resistors may be equal to a stress coefficient of the second lateral epitaxial resistor. In some embodiments, the stress coefficients of the first and second vertical epitaxial resistors may be different from stress coefficients of the first and second lateral epitaxial resistors.

In an embodiment, an epitaxial layer may be disposed over the surface of the semiconductor substrate. The epitaxial layer may have a first surface distal from the semiconductor substrate and a second surface proximate to the semiconductor substrate. The first and second vertical epitaxial resistors may each comprise respective first and second pickups implanted upon and diffused into the first surface of the epitaxial layer and a respective buried structure disposed under the first surface of the epitaxial layer and under the first and second pickups. In an embodiment, each respective first buried structure may have a density of atoms that results in a respective first low resistance path with a respective first resistance lower than a resistance of the epitaxial layer. In an embodiment, the epitaxial layer may have a p-well diffusion/implant region that forms an electrical barrier to electron flow, thus avoiding a current flow through the respective p-well regions of the epitaxial layer. A respective current may pass from the first pickup, through a respective first region of the epitaxial layer, through the respective first buried structure, and through a respective second region of the epitaxial layer to the second pickup. The respective current may pass through the respective first and second regions of the epitaxial layer in a direction substantially perpendicular to the first surface of the epitaxial layer, and the respective buried structure may have a respective first length dimension and a respective first width dimension, the respective first length dimension parallel to the respective first surface of the epitaxial layer.

In some embodiments, the first and second lateral epitaxial resistors may each include respective first and second pickups implanted upon and diffused into the first surface of the epitaxial layer. A respective current may pass from the first pickup, through a respective third region of the epitaxial layer, through a respective fourth region of the epitaxial layer, and through a respective fifth region of the epitaxial layer to the second pickup. The respective current may pass through the respective fourth region in a direction substantially parallel to the first surface of the epitaxial layer.

In an embodiment, the electronic circuit may include a Hall effect element disposed upon the semiconductor substrate and proximate to the resistor bridge. The resistor bridge can be configured to sense a stress value of Hall effect element.

In some embodiments, a compensation circuit may be disposed upon the semiconductor substrate and coupled to the resistor bridge and operable to generate a compensation signal. The compensation circuit can be configured to receive the differential signal from the resistor bridge.

In some embodiments, an amplifier may be disposed upon the semiconductor substrate and coupled to the Hall effect element and the compensation circuit and operable to generate an amplified signal. The amplifier can be operable to change gain of the amplified signal depending upon a value of the compensation signal.

In some embodiments, the electronic circuit may include an amplifier disposed upon the semiconductor substrate and coupled to the Hall effect element and operable to generate an amplified signal, a first analog-to-digital converter disposed upon the semiconductor substrate and coupled to receive the amplified signal from the amplifier and operable to generate a first digital signal, a processor disposed upon the semiconductor substrate and coupled to receive the first digital signal and operable to generate a processed signal wherein the processed single has a gain with respect to the first digital signal, and a second analog-to-digital converter disposed upon the semiconductor substrate, coupled to the resistor bridge and operable to generate a second digital signal responsive to the differential signal. The processor may be coupled to receive the second digital signal and operable to change the gain with respect to the first digital signal to generate the processed signal.

In some embodiments, the electronic circuit includes a current generator operable to generate a drive current that passes through the Hall effect element. The compensation circuit may be coupled to the current generator and operable to provide the compensation signal to the current generator.

In some embodiments, the above electronic circuit can include one or more of the following aspects in any combination.

In other aspects, the present disclosure is directed towards an electronic circuit having a semiconductor substrate, a Hall effect element disposed upon the semiconductor substrate, and a resistor bridge disposed upon the semiconductor substrate and proximate to the Hall effect element. The resistor bridge can include a first set of resistive elements having a first vertical epitaxial resistor and a first lateral epitaxial resistor coupled in series and a second set of resistive elements having a second vertical epitaxial resistor and a second lateral epitaxial resistor coupled in series. The first set of resistive elements and the second set of resistive elements may be coupled in parallel, and the resistor bridge may be operable to sense a stress value of the semiconductor substrate and the Hall effect element. The resistor bridge may be operable to generate a differential signal responsive to the stress value of the semiconductor substrate and the Hall effect element.

In some embodiments, the above electronic circuit can include one or more of the following aspects in any combination. In some embodiments, each resistive element of the first and second sets of resistive elements may have the same temperature coefficient. A stress coefficient of the first vertical epitaxial resistor may be equal to a stress coefficient of the second vertical epitaxial resistor. A stress coefficient of the first lateral epitaxial resistors may be equal to a stress coefficient of the second lateral epitaxial resistor. The stress coefficients of the first and second vertical epitaxial resistors may be different from stress coefficients of the first and second lateral epitaxial resistors.

In some embodiments, the electronic circuit may include an epitaxial layer disposed over the surface of the semiconductor substrate, the epitaxial layer having a first surface distal from the semiconductor substrate and a second surface proximate to the semiconductor substrate. The first and second vertical epitaxial resistors may each include respective first and second pickups implanted upon and diffused into the first surface of the epitaxial layer and a respective buried structure disposed under the first surface of the epitaxial layer and under the first and second pickups. Each respective first buried structure may have a density of atoms that results in a respective first low resistance path with a respective first resistance lower than a resistance of the epitaxial layer. A respective current may pass from the first pickup, through a respective first region of the epitaxial layer, through the respective first buried structure, and through a respective second region of the epitaxial layer to the second pickup. The respective current may pass through the respective first and second regions of the epitaxial layer in a direction substantially perpendicular to the first surface of the epitaxial layer. The respective buried structure has a respective first length dimension and a respective first width dimension, the respective first length dimension parallel to the respective first surface of the epitaxial layer.

In some embodiments, the first and second lateral epitaxial resistors may each include respective first and second pickups implanted upon and diffused into the first surface of the epitaxial layer. A respective current may pass from the first pickup, through a respective third region of the epitaxial layer, through a respective fourth region of the epitaxial layer, and through a respective fifth region of the epitaxial layer to the second pickup. The respective current may pass through the respective fourth region in a direction substantially parallel to the first surface of the epitaxial layer.

In some embodiments, the electronic circuit may include a compensation circuit disposed upon the semiconductor substrate and coupled to the resistor bridge and operable to generate a compensation signal. The compensation circuit may be configured to receive the differential signal from the resistor bridge.

In some embodiments, the electronic circuit may include an amplifier disposed upon the semiconductor substrate and coupled to the Hall effect element and the compensation circuit and operable to generate an amplified signal. The amplifier may be operable to change gain of the amplified signal depending upon a value of the compensation signal.

In some embodiments, the electronic circuit may include an amplifier disposed upon the semiconductor substrate and coupled to the Hall effect element and the compensation circuit and operable to generate an amplified signal, a first analog-to-digital converter disposed upon the semiconductor substrate and coupled to receive the amplified signal from the amplifier and operable to generate a first digital signal, a processor disposed upon the semiconductor substrate and coupled to receive the first digital signal and operable to generate a processed signal wherein the processed single has a gain with respect to the first digital signal, and a second analog-to-digital converter disposed upon the semiconductor substrate, coupled to the resistor bridge and operable to generate a second digital signal responsive to the differential signal. The processor may be further coupled to receive the second digital signal and operable to change the gain with respect to the first digital signal to generate the processed signal.

In some embodiments, the electronic circuit may include a current generator operable to generate a drive current that passes through the Hall effect element. The compensation circuit may be coupled to the current generator and operable to provide the compensation signal to the current generator.

In some embodiments, the above electronic circuit can include one or more of the following aspects in any combination.

BRIEF DESCRIPTION OF THE DRAWINGS

The foregoing features of the invention, as well as the invention itself may be more fully understood from the following detailed description of the drawings, in which:

FIG. 2 is a cross section showing an example of a vertical epitaxial resistor of FIG. 1 disposed within an epitaxial layer over the substrate of FIG. 1;

FIG. 2A is a cross section of the substrate of FIG. 1 showing an example of a lateral epitaxial resistor of FIG. 1 disposed within an epitaxial layer over the substrate;

Like reference symbols in the various drawings indicate like elements.

DETAILED DESCRIPTION

Figure 1:
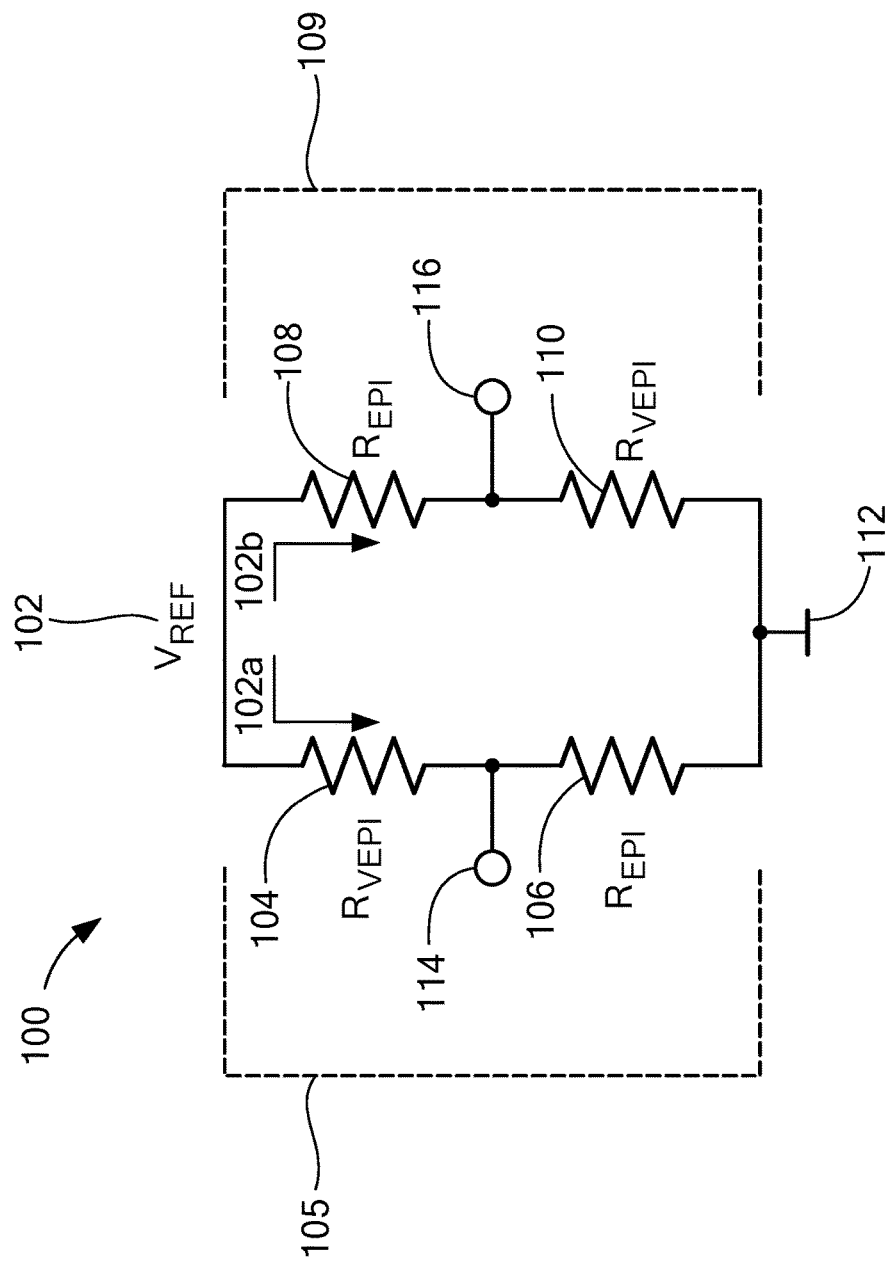
FIG. 1 is a circuit diagram of a resistor bridge circuit having two vertical epitaxial resistors and two lateral epitaxial resistors that can be disposed over a substrate.

As used herein, the term "magnetic field sensing element" is used to describe a variety of electronic elements that can sense a magnetic field. The magnetic field sensing element can be, but is not limited to, a Hall effect element, a magnetoresistance element, or a magnetotransistor.

As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

As used herein, the term "predetermined," when referring to a value or signal, is used to refer to a value or signal that is set, or fixed, in the factory at the time of manufacture, or by external means, e.g., programming, thereafter. As used herein, the term "determined," when referring to a value or signal, is used to refer to a value or signal that is identified by a circuit during operation, after manufacture.

As used herein, the term "active electronic component" is used to describe an electronic component that has at least one p-n junction. A transistor, a diode, and a logic gate are examples of active electronic components. In contrast, as used herein, the term "passive electronic component" as used to describe an electronic component that does not have at least one p-n junction. A capacitor and a resistor are examples of passive electronic components.

The terms "parallel" and "perpendicular" may be used in various contexts herein. It should be understood that the terms parallel and perpendicular do not require exact perpendicularity or exact parallelism, but instead it is intended that normal manufacturing tolerances apply, which tolerances depend upon the context in which the terms are used. In some instances, the term "substantially" is used to modify the terms "parallel" or "perpendicular." In general, use of the term "substantially" reflects angles that are beyond manufacturing tolerances, for example, within +/−ten degrees.

As used herein, the term "current generator" is used to describe either a current source or a current sink. It should be understood that a current source has a current output and a current sink has a current input, with a high output or input impedance, respectively.

As used herein, the term "current passing terminal" is used to describe a terminal of an active or passive electronic component that either receives a current or out of which a current comes. Thus, it will be appreciated that both a collector and emitter of a bipolar junction transistor (BJT) are current passing terminals. It will also be appreciated that both a source and a drain of the field effect transistor (FET) are current passing terminals.

As used herein, the term "substrate" is used to describe any type of structure with a flat surface upon which semiconductor materials can be deposited and/or into which semiconductor materials can be implanted and diffused. In some embodiments, the substrate is a P-type silicon substrate having a particular range of concentrations of P-type atoms (i.e., ions)

As used herein, the term "epi" is used to refer to an epitaxial layer, for example, an N-type epitaxial layer, disposed over a substrate, for example, a P-type substrate, and having a particular range of concentrations of N-type atoms (i.e. ions).

As used herein, the term "N+" or "NP" is used to refer to a region implanted and diffused into a semiconductor layer, for example, into a surface of the epitaxial layer furthest from the substrate, and having another particular range of concentrations of N-type atoms (i.e. ions).

As used herein, the term "Light-N" or simply "LN" is used to refer to a region implanted and diffused into a semiconductor layer, for example, into a surface of the epitaxial layer further from the substrate, and having a particular range of concentrations of N-type atoms (i.e. ions).

As used herein, the term "P-well" is used to refer to a region implanted and diffused into a semiconductor layer, for example, into a surface of the epitaxial layer further from the substrate, and having a particular range of concentrations of P-type atoms (i.e. ions).

As used herein, the term "P-type buried layer" or simply "PBL" is used to refer to a region implanted and diffused into a semiconductor layer, for example, implanted into the substrate and then upwardly diffused into the epitaxial (epi) layer (also referred to herein as an epi layer). The epi layer can be grown after PBL implant and diffusion steps, and the upward diffusion into epi layer can be performed during a field oxidation process.

As used herein, the term "N-type buried layer" or simply "NBL" is used to refer to a region implanted and diffused into a semiconductor layer, for example, implanted into the substrate and then upwardly diffused into the epitaxial (epi) layer. The epi layer can be grown after NBL implant and diffusion steps, and the upward diffusion into epi layer can be performed during a field oxidation process.

As used herein, the term "P+" or "PP" is used to refer to a region implanted and diffused into a semiconductor layer, for example, into a surface of the epitaxial layer furthest from the substrate, and having another particular range of concentrations of P-type atoms (i.e. ions).

As used herein, the concentrations of the above types of semiconductor structures can fall into the following ranges:
   substrate=about $1 \times 10^{15}$ P-type atoms per cm3, for example, boron atoms.
   epi=about $1 \times 10^{15}$ to about $6 \times 10^{15}$ N-type atoms per cm3, for example, Arsenic atoms,
      where: $5 \times 10^{14}$ to $1 \times 10^{15}$ can be representative of a concentration of epi bulk doping, and $5 \times 10^{15}$ to $1 \times 10^{16}$ can be representative of a concentration at a surface region of the epi layer at about 2 um depth created by an additional epi implant step. (Alternatively, $1 \times 10^{15}$ to $6 \times 10^{15}$).
   N+=about $1 \times 10^{20}$ N-type atoms per cm3, for example, phosphorous atoms.
   LN=about 1 to $2 \times 10^{17}$ atoms per cm3, for example, phosphorous atoms.
   P-well=about $1 \times 10^{16}$ P-type atoms per cm3, for example, boron atoms.
   PBL=about $1 \times 10^{18}$ to about $2 \times 10^{18}$ P-type atoms per cm3, for example, boron atoms.
   NBL=about $1 \times 10^{19}$ to about $1.5 \times 10^{19}$ N-type atoms per cm3, for example, antimony atoms.
   P+=about $3 \times 10^{19}$ to about $5 \times 10^{19}$ P-type atoms per cm3, for example, boron atoms.

In some embodiments, the concentrations are outside of the above ranges or values, but can be within about +/−twenty percent of the above ranges or values.

It should be noted that reference is sometimes made herein to assemblies having a particular shape (e.g., rectangular or square). One of ordinary skill in the art will appreciate, however, that the techniques described herein are applicable to a variety of sizes and shapes.

Now referring to FIG. 1, a resistor bridge 100 is shown having four resistive elements 104, 106, 108, 110. A first end of resistor bridge 100 is coupled to a reference voltage ($V_{REF}$) 102 and a second end of resistor bridge 100 is coupled to a voltage reference (i.e., ground) 112.

In an embodiment, resistive elements may include vertical epitaxial resistor and lateral epitaxial resistors. For example, resistor bridge 100 can include a first set of resistive elements 105 having a first vertical epitaxial resistor 104 and a first lateral epitaxial resistor 106. First vertical epitaxial resistor 104 and first lateral epitaxial resistor 106 may be coupled in series. When coupled in series, all of a first portion 102a of a reference current 102 passes through both first vertical epitaxial resistor 104 and first lateral epitaxial resistor 106.

Resistor bridge 100 can include a second set of resistive elements 109 having a second vertical epitaxial resistor 110 and a second lateral epitaxial resistor 108. Second vertical epitaxial resistor 110 and second lateral epitaxial resistor 108 may be coupled in series. When coupled in series, all of a second portion 102b of reference current 102 passes through both second vertical epitaxial resistor 110 and second lateral epitaxial resistor 108.

In an embodiment, first set of resistive elements 105 and second set of resistive elements 109 may be coupled in parallel. When coupled in parallel, at least the first portion 102a of reference current 102 passes through the first set of resistive elements 105 and at least the second portion 102b of reference current 102 passes through the second set of resistive elements 109.

A differential signal 114, 116 (i.e., a differential voltage) can be generated between a first terminal and a second terminal of resister bridge 100. It should be appreciated that the differential signal 114, 116 can have a positive or negative value, depending upon substrate stress experienced by the resistor bridge 100.

Resistor bridge 100 may include two or more different types of resistors (e.g., vertical epitaxial resistor, lateral epitaxial resistor). In other embodiments, resistor bridge 100 may include two resistors, each of different types. In still other embodiments, resistor bridge 100 may include a single resistor.

In an embodiment, each of the resistive elements 104, 106, 108, 110 may have the same or substantially similar resistance temperature coefficient. For typical stress and temperature ranges of operation (e.g., 205° C., 70 MPa), a resistance change due to temperature (i.e., a temperature coefficient) is often about three orders of magnitude bigger than resistance change due to stress (i.e., a stress coefficient) of a substrate on which resistive elements 104, 106, 108, 110 are formed, regardless of the type of resistive element used. Thus, small temperature changes can dramatically affect an output of resistor bridge 100 if temperature coefficients are different for one or more resistive elements in resistor bridge 100. However, if temperature coefficients of the four resistors 104, 106, 108, 110 the same or substantially similar, the differential signal 114, 116 will not change due to the direct effect of temperature.

Two or more of the resistive elements 104, 106, 108, 110 may have the same stress coefficient. In an embodiment, resistive elements of the same type can have the same or substantially similar stress coefficient. For example, a stress coefficient of the first vertical epitaxial resistor 104 can be equal to a stress coefficient of the second vertical epitaxial resistor 110. Further, a stress coefficient of the first lateral epitaxial resistor 106 can be equal to a stress coefficient of the second lateral epitaxial resistor 108. However, a stress coefficient of the first and second vertical epitaxial resistors 106, 108 can be different from a stress coefficient of the first and second lateral epitaxial resistors 106, 108.

In an embodiment, values (i.e., resistances) of one or more of the resistors 104, 106, 108, 110 may experience stress changes due to a temperature change (or other stress factors) upon the resistor bridge 100. In some embodiments, the stress changes may be caused by humidity, such as humidity absorption by a housing or packaging (e.g., plastic packaging) that the resistor bridge 100 and/or a Hall effect element are contained within. At a given temperature, if the humidity changes, the housing can absorb moisture and expand and or swell, causing a change in the stress profile seen by the resistor bridge (and/or Hall effect element). Thus, these changes in resistance may cause the differential signal 114, 116 of resistor bridge 100 to change. As will be discussed in greater detail below, changes in differential signal 114, 116 may be used to sense stress of a substrate and compensate for a change in sensitivity of a Hall effect element resulting from the stress of the substrate.

Referring now to FIG. 2, a vertical epitaxial resistor 201 is disposed in an N-type epitaxial layer 203, which is disposed upon P-type semiconductor substrate 202. The substrate 202 has a substrate surface 202a upon which the epitaxial layer 203 is disposed, for example with deposition fabrication techniques. In an embodiment, vertical resistor 201 is the same or substantially similar to first and second vertical epitaxial resistors 104, 110 of FIG. 1.

A PBL region 216 can join with a P-well region 214, forming an electrical barrier to electron flow, the barrier defining a perimeter boundary of the vertical epitaxial resistor 201.

Techniques for deposition and diffusion of the P-well region 216 and the PBL region 214 will be understood. However, let it suffice here to say that the PBL region 216 can be deposited onto the surface 202a of the substrate 202 before the epitaxial layer 203 is deposited upon the surface 202a of the substrate 202. The P-well region 214 can be deposited upon an outer surface 203a of the epitaxial layer 203, along with another P-well region 212. Heating of vertical epitaxial resistor 201 causes the PBL region 216 to diffuse upward into the epitaxial layer 203 and downward into the substrate 202. Heating of the vertical epitaxial resistor 201 also causes the P-well regions 214, 212 to diffuse downward into the epitaxial layer 203.

An NBL region 204, formed in a way similar to formation of the PBL region 218, can be disposed within the epitaxial layer 203 and under the outer (top) surface 203a of the epitaxial layer 203

Two (or more) N+ pickups 208, 210 can be deposited and diffused into the surface of the epitaxial layer 203. The pickups 208, 210 can be used to form a two-terminal connection to vertical epitaxial resistor 201, via metal contacts (not shown), formed in a metal layer (not shown), and that are in electrical communication with the pickups 208, 210.

The epitaxial layer 203 has resistances 218, 220, between the pickups 208, 210 and the NBL region 204.

The P-well region 212 can result in currents that flow through the resistances 218, 220 being directed substantially vertically to the surface 203a of the epitaxial layer 203.

First and second vertical epitaxial resistors 104, 110 can be formed by passing the reference current 102 of FIG. 1 between the two pickups 208, 210. It will be understood that a resistance of the resulting vertical epitaxial resistor 201 is dominated by a series sum of the two resistances 218, 220.

The resistances 218, 220 have a piezo-resistance coefficient of about $53.4 \times 10^{-11}$ per Pascal due to stress (i.e., stress coefficients) in the x and y directions, and thus, the resistances 218, 222 change value with stresses upon the substrate 202.

Referring now to FIG. 2A, a lateral epitaxial resistor 211 is disposed in an N-type epitaxial layer 203, which is disposed upon P-type semiconductor substrate 202. The substrate 202 has a substrate surface 202a upon which the epitaxial layer 203 is disposed, for example with deposition fabrication techniques. In an embodiment, lateral epitaxial resistor 211 is the same or substantially similar to first and second lateral epitaxial resistors 106, 108 of FIG. 1.

A PBL region 217 can join with a P-well region 215, forming an electrical barrier to electron flow, the barrier defining a perimeter boundary of lateral epitaxial resistor 211.

Techniques for deposition and diffusion of the P-well region 217 and the PBL region 215 will be understood. However, let it suffice here to say that the PBL region 217 can be deposited onto the surface 202a of the substrate 202 before the epitaxial layer 203 is deposited upon the surface 202a of the substrate 202. The P-well region 215 can be deposited upon an outer surface 203a of the epitaxial layer 203. Heating of lateral epitaxial resistor 211 causes the PBL region 217 to diffuse upward into the epitaxial layer 203 and downward into the substrate 202. Heating of lateral epitaxial resistor 211 also causes the P-well regions 215, 212 to diffuse downward into the epitaxial layer 203.

Two (or more) N+ pickups 207, 209 and N+ plugs 223, 225 can be deposited and diffused into the surface of the epitaxial layer 203. The pickups 207, 209 and plugs 223, 225 can be used to form a two-terminal connection to lateral epitaxial resistor 211, via metal contacts (not shown), formed in a metal layer (not shown), and that are in electrical communication with the pickups 207, 209 and plugs 223, 225.

The epitaxial layer 203 has a resistance 219 between the pickups 207, 209 and the plugs 223, 225.

The P-well region 215 can result in currents that flow through the resistance 219 being directed substantially parallel to the surface 203a of the epitaxial layer 203.

First or second lateral epitaxial resistors 106, 108 can be formed by passing the reference current 102 of FIG. 1 between the two pickups 207, 209 and plugs 223, 225. It will be understood that a resistance of the resulting lateral epitaxial resistor 211 is dominated by the value of the resistance 219.

The resistance 219 has a piezo-resistance coefficient (i.e., stress coefficient) of about $-24.4 \times 10^{-11}$ per Pascal to stress in the x and y directions, and thus, the resistance 219 changes value with stresses upon the substrate 202.

Calculations resulting in benefits of a resistor bridge having one or more vertical epitaxial resistors 201 (e.g., vertical epitaxial resistors 104, 110 of FIG. 1) and one or more lateral epitaxial resistors 211 (e.g., lateral epitaxial resistors 106, 108 of FIG. 1), each having the above-described piezoelectric coefficients are described below in conjunction with FIG. 3.

Figure 3:
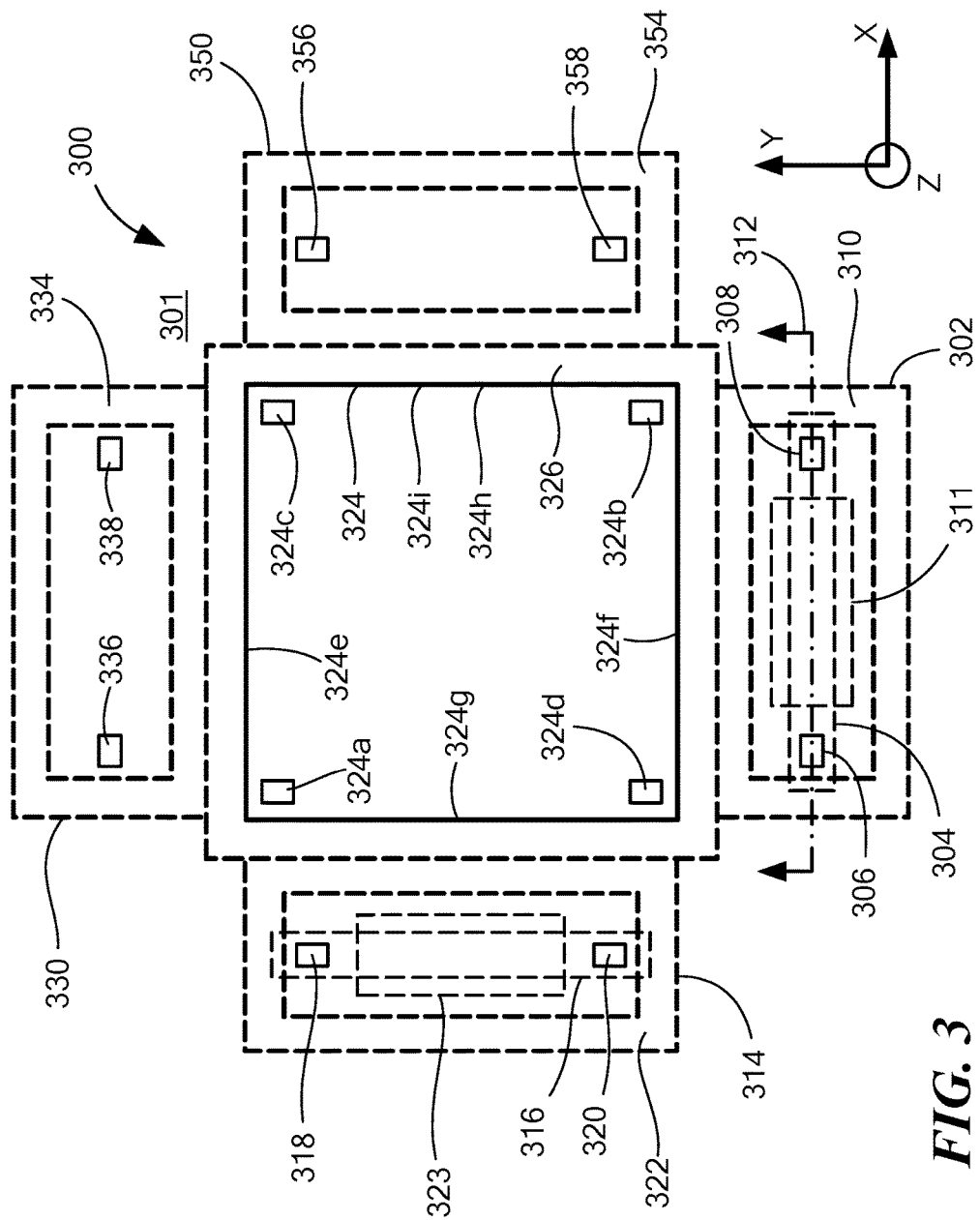
FIG. 3 is a top view of the substrate of FIG. 1 showing a Hall effect element and four resistors of the type shown in FIGS. 1-2A.

Referring Now to FIG. 3, an electronic circuit 300 is formed upon an epitaxial layer 301 over a substrate, the substrate under the epitaxial layer 301.

The electronic circuit 300 can include a Hall effect element 324, shown in part as a bounded portion 324i of the epitaxial layer 301, bounded by an electrical barrier 326 to electron flow, the barrier defining a perimeter boundary of the Hall effect element 324. The electrical barrier 326 can be comprised of a PBL region under a P-well region, much the same as the PBL region 216 and the P-well region 214 of FIG. 2.

The bounded portion 324i can form a Hall plate of the Hall effect element 324. Over the bounded portion 324 can be a field plate, which, in some embodiments, can be formed in a metal layer. The field plate can have approximately the same dimensions in the x-y plane as the bounded portion 324i, thus reference designator 324i can be used to refer to either the Hall plate, i.e., bounded portion, in the epitaxial layer 321 or the field plate above the epitaxial payer 301.

The Hall effect 324 element can include four pickups 324a, 324b, 324c, 324d, which can be used and coupled in the same way, or in a similar way, as the four terminals 420a, 420b, 420c, 420d described below in conjunction with FIGS. 4-4B. As described above in conjunction with FIG. 2, above the four pickups 324a, 324b, 324c, 324b can be a corresponding four contacts (not shown) formed in a metal layer.

The bounded portion 324i of the Hall effect element 324 can, in some embodiments, form a square shape having four sides or edges 324e, 324f, 324g, 324g. However, in other embodiments, the bounded portion 324i (and the Hall plate and field plate) need not have a square shape.

It should be understood that the Hall effect element 324 is a horizontal or planar Hall effect element, which has an axis of maximum sensitivity parallel to a z-axis.

In an embodiment, electronic circuit 300 includes four resistive elements 302, 314, 330, 350. Each of the four resistive elements 302, 314, 330, 350 may be positioned a predetermined distance from Hall effect element 324. In some embodiments, each of the four resistive elements 302, 314, 330, 350 are aligned along a respective side or edge of Hall effect element 324, such that they are in contact with a side or edge of Hall effect element 324.

First and second resistive elements 302, 314 may be the same as or similar to first and second vertical epitaxial resistor 104, 110 of FIG. 1 and vertical epitaxial resistor 201 of FIG. 2. Third and fourth resistive elements 330, 350 may be the same as or similar to first and second lateral epitaxial resistor 106, 108 of FIG. 1 and lateral epitaxial resistor 211 of FIG. 2.

In an embodiment, first and fourth resistor 302, 350 are coupled in series and form a first set of resistive elements that is the same or similar to first set of resistive elements 105 of FIG. 1. Second and third resistors 314, 330 can be coupled in series and form a second set of resistive elements that is the same or similar to first set of resistive elements 109 of FIG. 1. First set and second set of resistive elements may be coupled in parallel to form a resistor bridge, that is the same or similar to resistor bridge 100 of FIG. 1.

First resistor 302 can include an NBL region 304, a P-well region 311, a barrier region 310, and two pickups 306, 308, which can be the same as or similar to the NBL region 204, the P-well region 212, the barrier region formed from the P-well region and the PBL region 214, 216, and the pickups 208, 210 of FIG. 2.

The NBL region 304 has a length with a length dimension parallel to the x-axis and a width with a width dimension parallel to the y-axis. The length dimension of the NBL region 304 can be parallel to the edge 324f of the Hall effect element 324. However, in other embodiments, the length dimension is not parallel to an edge of the Hall effect element 324.

While the width dimension of the NBL region 304 is shown to be less than the length dimension, in other embodiments, the width dimension can be equal to or greater than the length dimension.

Second resistor 314 can include an NBL region 316, a P-well region 323, a barrier region 322, and two pickups 318, 320, which can be the same as or similar to the NBL region 204, the P-well region 212, the barrier region formed from the P-well region and the PBL region 214, 216, and the pickups 208, 210 of FIG. 2.

The NBL region 316 has a length with a length dimension parallel to the y-axis and a width with a width dimension parallel to the x-axis. The length dimension of the NBL region can be parallel to the edge 324g of the Hall effect element 324. However, in other embodiments, the length dimension is not parallel to an edge of the Hall effect element. 324. As shown, the length dimension of the NBL region 304 of the first resistor 302 is substantially perpendicular to the length dimension of the NBL region 316 of the second resistor 314. However, other relative orientations are also possible.

While the width dimension of the NBL region 316 is shown to be less than the length dimension, in other embodiments, the width dimension can be equal to or greater than the length dimension.

Third resistor 330 can include a barrier region 334 and two pickups 336, 338, which can be the same as or similar to the barrier region formed from the P-well region and the PBL region 215, 217, and the pickups 207, 209 of FIG. 2A.

In an embodiment, the barrier region 334 has a length with a length dimension parallel to the y-axis and a width with a width dimension parallel to the x-axis. The length dimension of the barrier region 334 can be parallel to the edge 324e of the Hall effect element 324. However, in other embodiments, the length dimension is not parallel to an edge of the Hall effect element 324. As shown, the length dimension of barrier region 334 of third resistor 330 is substantially perpendicular to the length dimension of the NBL region 316 of the second resistor 314. However, other relative orientations are also possible.

While the width dimension of barrier region 334 is shown to be less than the length dimension, in other embodiments, the width dimension can be equal to or greater than the length dimension.

Fourth resistor 350 can include a barrier region 354 and two pickups 356, 358, which can be the same as or similar to the barrier region formed from the P-well region and the PBL region 215, 217, and the pickups 207, 209 of FIG. 2A.

In an embodiment, the barrier region 354 has a length with a length dimension parallel to the y-axis and a width with a width dimension parallel to the x-axis. The length dimension of the barrier region 354 can be parallel to the edge 324h of the Hall effect element 324. However, in other embodiments, the length dimension is not parallel to an edge of the Hall effect element. 324. As shown, the length dimension of barrier region 354 of fourth resistor 350 is substantially perpendicular to the length dimension of the NBL region 304 of first resistor 314. However, other relative orientations are also possible.

While the width dimension of barrier region 354 is shown to be less than the length dimension, in other embodiments, the width dimension can be equal to or greater than the length dimension.

The first and third resistors 302, 330, respectively, are shown to be parallel to each other and on opposite sides of the Hall effect element 324 and also the second and fourth resistors 314, 350, respectively, are shown to be parallel to each other and on other opposite sides of the Hall effect element 324. However, in other embodiments, the first and second resistors 302, 314, respectively, can be parallel to each other and on opposite sides of the Hall effect element 324 and also the third and fourth resistors 330, 350, respectively, can be parallel to each other and on other opposite sides of the Hall effect element 324.

In an embodiment, electronic circuit 300 can form part of the electronic circuits 402, 404, 406 discussed below with respect to FIGS. 4-4B.

As described above in conjunction with FIG. 2, the resistances 218, 220 have a piezo-resistance coefficient (i.e., stress coefficient) of about $53.4 \times 10^{-11}$ per Pascal, and thus, first and second resistors 302, 314 change resistance value with stresses in the x and y direction upon a substrate, e.g., 202, according to $53.4 \times 10^{-11}$ per Pascal. Further, the resistance 219 has a piezo-resistance coefficient of about $-24.4 \times 10^{-11}$ per Pascal, and thus, third and fourth resistors 330, 350 change resistance value with stresses in the x and y direction upon the substrate, e.g., 202, according to $-24.4 \times 10^{-11}$ per Pascal.

For example, a stress sensitivity of a vertical epitaxial resistor at 25° C. is:

$$\frac{\Delta R_{VEPI}}{R_{VEPI}} = \pi_{VEPI}(\sigma_X + \sigma_Y) = 53.4\% / \text{GPa}(\sigma_X + \sigma_Y)$$

A stress sensitivity of a lateral epitaxial resistor at 25° C. is:

$$\frac{\Delta R_{EPI}}{R_{EPI}} = \pi_{EPI}(\sigma_X + \sigma_Y) = -24.4\% / \text{GPa}(\sigma_X + \sigma_Y)$$

where:
$\sigma_x$=stress parallel to the x-axis, $\sigma_y$=stress parallel to the y-axis, and GPa=GigaPascals=$10^9$ Pascals.

Thus, the sensitivity of a resistor bridge that includes two vertical epitaxial resistors and two lateral epitaxial resistors (e.g., resistor bridge 100 of FIG. 1) can be derived using the following formulas and algebraic steps:

$$V_+ = \frac{R_{VEPI}}{R_{EPI} + R_{EPI}} \quad (1)$$

$$V_+ = \frac{R_{VEPI0}[1 + \pi_{VEPI}(\sigma_X + \sigma_Y)]}{R_{EPI0}[1 + \pi_{EPI}(\sigma_X + \sigma_Y)] + R_{VEPI0}[1 + \pi_{VEPI}(\sigma_X + \sigma_Y)]}$$

$$R_{EPI0} = R_{VEPI0}$$

$$V_+ = \frac{1 + \pi_{VEPI}(\sigma_X + \sigma_Y)}{2 + \pi_{EPI}(\sigma_X + \sigma_Y) + \pi_{VEPI}(\sigma_X + \sigma_Y)}$$

$$V_+ = \frac{1}{2} \frac{1 + \pi_{VEPI}(\sigma_X + \sigma_Y)}{1 + \frac{\pi_{EPI} + \pi_{VEPI}}{2}(\sigma_X + \sigma_Y)}$$

$$V_- = \frac{1}{2} \frac{1 + \pi_{EPI}(\sigma_X + \sigma_Y)}{1 + \frac{\pi_{EPI} + \pi_{VEPI}}{2}(\sigma_X + \sigma_Y)}$$

$$V_+ - V_- = \frac{1}{2} \frac{\pi_{VEPI}(\sigma_X + \sigma_Y) - \pi_{EPI}(\sigma_X + \sigma_Y)}{1 + \frac{\pi_{EPI} + \pi_{VEPI}}{2}(\sigma_X + \sigma_Y)}$$

$$V_+ - V_- = \frac{1}{2} \frac{(\pi_{VEPI} - \pi_{EPI})(\sigma_X + \sigma_Y)}{1 + \frac{\pi_{EPI} + \pi_{VEPI}}{2}(\sigma_X + \sigma_Y)}$$

If $\frac{\pi_{EPI} + \pi_{VEPI}}{2}(\sigma_X + \sigma_Y) << 1$ $$V_+ - V_- \cong \frac{1}{2}(\pi_{VEPI} - \pi_{EPI})(\sigma_X + \sigma_Y)$$

$$V_+ - V_- \cong 38.9\% \frac{1}{\text{GPa}}(\sigma_X + \sigma_Y)$$

The piezo-Hall effect at 25° C. is:

$$\frac{\Delta S_1}{S_1} = 45\% \frac{1}{\text{GPa}}(\sigma_X + \sigma_Y) \quad (2)$$

where:
$\sigma_x$=stress parallel to the x-axis, $\sigma_y$=stress parallel to the y-axis, S=nominal sensitivity of a planar Hall effect element, and $\Delta S$=change in sensitivity.

Thus, Hall effect element 324 has a piezo-Hall coefficient of about $45 \times 10^{-11}$ per Pascal for stresses in the x and y directions, which is close to the piezo-resistance coefficient above (i.e., $38.9 \times 10^{-11}$ per Pascal). In some embodiments, a difference between a sensitivity of a resistor bridge and Hall effect element 324 (and over temperature) can be compensated in the digital domain, as will be discussed in greater detail below with respect to FIGS. 4-4B.

Stress coefficients shown in equations (1) and (2) are similar.

Thus, a resistor bridge (such as resistor bridge 100 of FIG. 1) can be configured to sense a change in stress of a substrate, which is related to a change of sensitivity in Hall effect element 324. For example, in one embodiment, in which a resistor bridge and Hall effect element 100 are in the same environment (e.g., same packaging, same integrated circuit, same device) a temperature in the environment and/or stresses may impact both the resistor bridge and Hall effect element in a similar fashion. A change in sensitivity of the resistor bridge due to stress of a substrate may mirror a change in sensitivity of Hall effect element 324 due to the same or similar stress. Thus, by measuring a change voltage of the resistor bridge, which is related to a change of stress in a substrate, a related change in sensitivity of Hall effect element can be determined. The voltage and can be used to compensate the Hall effect element's sensitivity drift.

Figure 4:
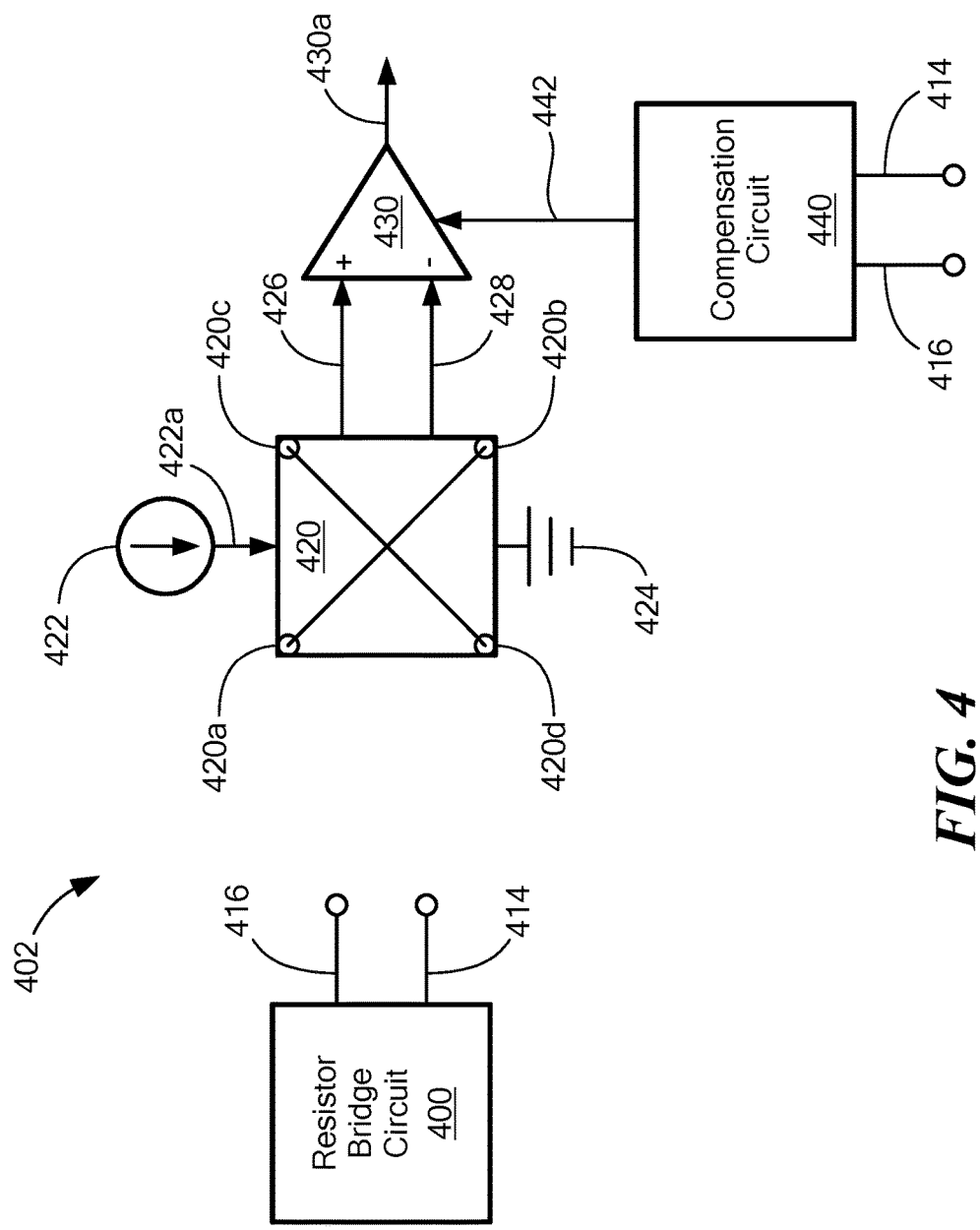
FIG. 4 is a first block diagram of an illustrative electronic circuit having a Hall effect element and a resistor bridge of the type shown in FIG. 1.
Figure 4A:
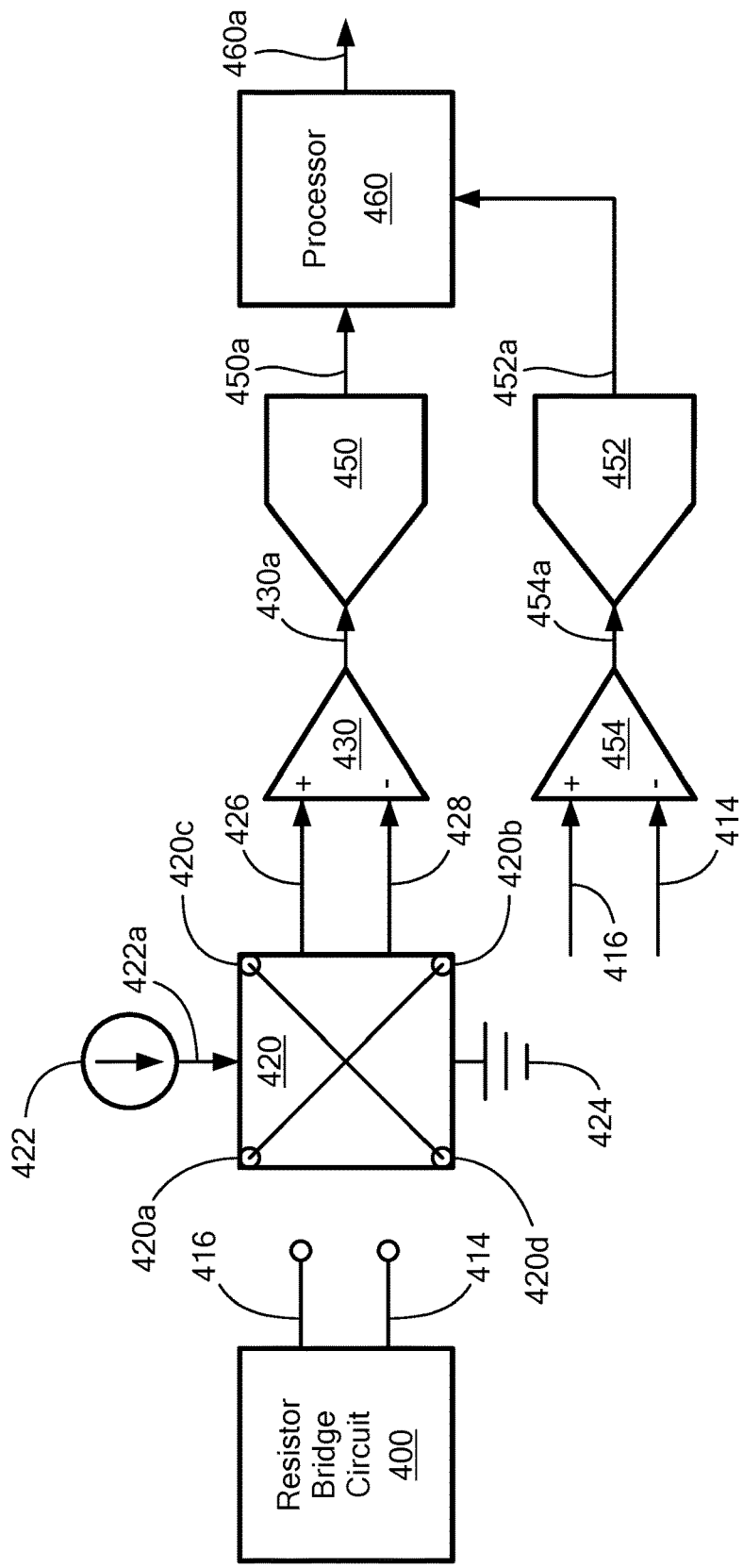
FIG. 4A is a second block diagram of another illustrative electronic circuit having a Hall effect element and a resistor bridge of the type shown in FIG. 1.
Figure 4B:
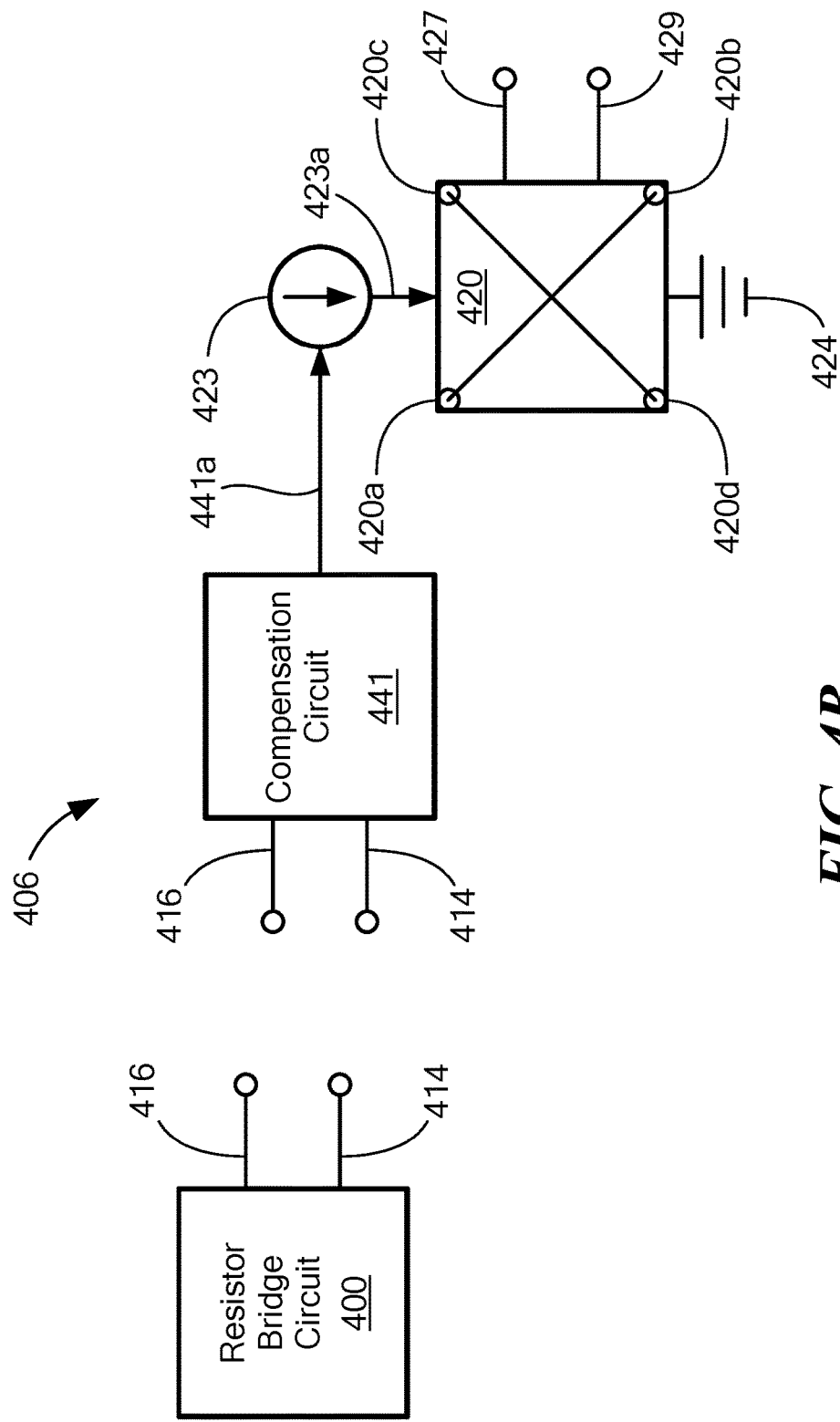
FIG. 4B is a third block diagram of another illustrative electronic circuit having a Hall effect element and a resistor bridge of the type shown in FIG. 1.

Now referring to FIGS. 4-4B, in which like elements are provided having like reference designations.

Now referring to FIG. 4, an electronic circuit 402 includes a resistor bridge 400 and a Hall effect element 420. Resistor bridge 400 is positioned a predetermined distance from Hall effect element 420. In some embodiments, resistor bridge 400 is in contact with or in close proximity to Hall effect element 420. For example, resistor bridge 400 may be disposed within an integrated circuit and positioned along one or more sides or edges of Hall effect element 420, such as the configuration illustrated in FIG. 3.

Resistor bridge 400 can be the same or substantially similar to resistor bridge 100 of FIG. 1. For example, resistor bridge 400 may have at least four resistive elements and may generate a differential signal 416, 414 between a first terminal 416 and a second terminal 414. The differential signal 416, 414 is related to the values of the resistive elements within resistor bridge 400. It should be appreciated that in other embodiments, resistor bridge may have two or a single resistor as well.

Hall effect element 420 has four terminals 420a-420d, respectively. A drive current source 422 is coupled to the first terminal 420a of Hall effect element 420. The drive current source 422 can generate a drive current 422a that passes from first terminal 420a through Hall effect element 420, to a second terminal 420b. A voltage reference (i.e., ground) 424 can be coupled to receive drive current 422a. A differential signal 426, 428 can be generated between a third terminal 420c and a fourth terminal 420d of Hall effect element 420. The differential output signal 426, 428 is related to an amplitude of drive current 422a and also related to a magnitude of an external magnetic field experienced by the Hall effect element 420.

The differential signal 426, 428 is also influenced by stress within a substrate upon which the Hall effect element 420 is disposed.

An amplifier 430 is coupled to Hall effect element 420 and coupled to receive signal 426, 428. Amplifier 430 can be configured to generate an amplified signal 430a.

In an embodiment, amplifier 430 is coupled to a compensation circuit 440. Compensation circuit 440 is coupled to receive the differential signal 416, 414 from resistor bridge 400 and configured to generate a compensation signal 441. In an embodiment, the compensation signal 442 is related to the differential signal 416, 414, related by a predetermined gain value of the compensation circuit 440. The compensation signal 442 can be received by a gain control terminals of the amplifier 430. The compensation signal 442 can also be offset (DC offset) in voltage from the differential signal 414, 416, depending upon circuit characteristics of the gain control terminals of the differential amplifier 430.

Amplitude of the differential signal 414, 416 and amplitude the compensation signal 442 are related by the gain value of the compensation circuit 440.

In operation, the amplifier 430 can change gain from a nominal gain (e.g., at room temperature) depending upon a value of the compensation signals 442. The gain value of the compensation circuit 440 can be one, greater than one, or less than one. Also, the gain of the operation amplifier 430 resulting from the compensation signal 442 can be one, greater than one, or less than one.

It should be understood that the Hall effect element 420 has a first sensitivity, which can be expressed, for example, in volts per unit of magnetic field experienced by the Hall effect element 420. Similarly, the amplified signal 430a has a second sensitivity, which can be expressed, for example, in volts per unit of magnetic field experienced by the Hall effect element. The first sensitivity of the Hall effect element 420 and the second sensitivity of the amplified signal 430a are related by a gain of the amplifier 430. Thus, a higher gain amplifier 430 results in a higher sensitivity of the amplified signal 430a.

It should also be understood that a change in sensitivity of the Hall effect element 420 due to stress in the substrate is described above to be in units of percentage per stress. Furthermore, a percentage error of sensitivity of the Hall effect element 420 results is the same percentage error in sensitivity of the amplified signal 430a.

A nominal gain (e.g., at room temperature of the operation amplifier can selected to achieve a desired (and preferably invariant) sensitivity of the amplified signal 430a. In some embodiments, it may be desirable that the operation amplifier 430 have a nominal gain sufficiently high such that thermal noise of the electronic circuit 402 is determined mostly by the electronic circuit 402, and less so by electronic circuits that may follow the operation amplifier 430. Thus, it may be desirable that the nominal gain of the amplifier be substantially greater than one, for example, ten.

As described above, the Hall effect element 420 change sensitivity due to stress in a percentage relationship and the amplified signal 430a may similarly change sensitivity by the in the same percentage relationship were it not for compensation by the amplifier 430. From the above, it should be understood that, with only a fixed gain of the amplifier 430, the amplified signal 430a would experience a percentage sensitivity change due to stress of a substrate that supports the electronic circuit 402. Thus, it is desirable that the gain of the amplifier 430 change to compensate for the stress by way of compensation signal 442.

Sensitivity compensation (e.g., gain compensations) of the amplified signal 430a can be determined according to several parameters, which can include the above described stress coefficient of the resistor bridge circuit 400 (see, e.g., equation (1)), the gain value of the compensation circuit 440, characteristics (another gain factor) of the gain control terminal of the operation amplifier 430, and nominal gain of the operation amplifier 430. Thus, compensation of the amplified signal 430a can be determined according to the above described stress coefficient of the resistor bridge circuit times a series of multiplicative gain factors.

The gain value of the compensation circuit 440 can be selected to achieve the amplified signal 430a with nominal gain thereof that has a reduced variation of sensitivity with temperature, which variation is most sensitive to stress of a substrate, which stress may be related to temperature of the substrate.

Now referring to FIG. 4A, in which like elements of FIG. 4 are shown having like reference designations, an electronic circuit 404 includes resistor bridge 400 positioned within a predetermined distance from Hall effect element 420. Resistor bridge 400 generates the differential signal 416, 414. In some embodiments, resistor bridge 400 is in contact with or in close proximity to Hall effect element 420. For example, resistor bridge 400 may be disposed within an integrated circuit and positioned along one or more sides or edges of Hall effect element, such as the configuration illustrated in FIG. 3.

As described above, amplifier 430 is configured to generate an amplified signal 430a. A first analog-to-digital converter 450 can be coupled to amplifier 430 and coupled to receive amplifier signal 430a. In an embodiment, first analog-to-digital converter 450 converts amplified signal 430a to a first digital signal 450a. A digital value of the digital signal 450a may represent an amplitude of amplifier signal 430a.

A differential amplifier 454 can be coupled to receive the different signal 414, 416 and can be operable to generate an amplified signal 454a.

Processor 460 is coupled to first analog-to-digital converter 450 and is coupled to receive first digital output signal 450a. Processor 460 can be configured to generate a processed signal 460a representative of the differential signal 426, 428. Processor 460 may also be coupled to a second analog-to digital converter 452.

In an embodiment, second analog-to-digital converter 452 is coupled to receive amplified signal 454a. In an embodiment, second analog-to-digital converter 452 converts amplified signal 454a to a second digital signal 452a. For example, in one embodiment, differential signal 416, 414 has a voltage value and is converted to the second digital value 452a. The second digital value 452a may represent an amplitude of differential signal 416, 414. Processor 460 is configured to receive second digital signal 452a.

In operation, and from discussion above, it should be apparent that, like the first sensitivity of the Hall effect element 420, and like the second sensitivity of the amplified signal 430a, the processed signal 460a has a third sensitivity, which can be expressed, for example, in a digital value per unit of magnetic field experienced by the Hall effect element 420. Also, it should be apparent from discussion above that a percentage error in the first sensitivity of the Hall effect element 420, the percentage error in sensitivity of the amplified signal 430a, and a percentage error in the processed signal 460a are essentially the same percentage error.

Sensitivity compensation of the processed signal 460a can be determined according to several parameters, which can include the above described stress coefficient of the resistor bridge circuit 400 (see, e.g., equation (1)), nominal gain of the amplifier 430, an effective gain value of the first analog-to-digital converter 450 (i.e., bits per volt), a gain value of the amplifier 454, an effective gain value of the second analog-to-digital converter 452 (i.e., bits per volt), and a gain factor that can be applied within the processor 460. Thus, compensation of the processor 430a can be determined according to the above described stress coefficient of the resistor bridge circuit 400 times a series of multiplicative gain factors.

The gain values of the above-described gain factors can be selected to achieve the processed signal 460a with nominal gain thereof and that has a reduced variation of sensitivity with temperature, which variation is most sensitive to stress of a substrate, which stress may be related to temperature of the substrate.

Now referring to FIG. 4B, in which like elements of FIG. 4 are shown having like reference designations, an electronic circuit 406 includes resistor bridge 400 coupled to compensation circuit 440. Compensation circuit 441 is configured to receive differential signal 416, 414 from resistor bridge 400. In an embodiment, compensation circuit 441 generates a compensation signal 441a based on differential signal 416, 414.

Hall effect element 410 can be coupled to current source 423 in the same way as described above for current source 422. Here, however, unlike the current source 422, the current source 422 includes a control terminal to receive the compensation signal 441a. Control signal 441a is operable to generate a controllable current 423a to the Hall effect element 420. As described above, a value of the current 423a determines a sensitivity of the Hall effect element 420.

In operation, and from discussion above, it should be apparent that the gain value of the compensation circuit 441 can be one, greater than one, or less than one. Also, the gain of the current source 423 resulting from the compensation signal 441a can be one, greater than one, or less than one. Further, the Hall effect element 420 has a sensitivity, which can be expressed, for example, in a digital value per unit of magnetic field experienced by the Hall effect element 420. Thus, the controllable current 423a can be provided to the Hall effect element 420 to compensate the sensitivity of the Hall effect element 420.

All references cited herein are hereby incorporated herein by reference in their entirety.

Having described preferred embodiments, which serve to illustrate various concepts, structures and techniques, which are the subject of this patent, it will now become apparent that other embodiments incorporating these concepts, structures and techniques may be used. Accordingly, it is submitted that the scope of the patent should not be limited to the described embodiments but rather should be limited only by the spirit and scope of the following claims.

Elements of embodiments described herein may be combined to form other embodiments not specifically set forth above. Various elements, which are described in the context of a single embodiment, may also be provided separately or in any suitable sub combination. Other embodiments not specifically described herein are also within the scope of the following claims.

What is claimed:

1. An electronic circuit comprising:
   a semiconductor substrate;
   an epitaxial layer disposed over a surface of the semiconductor substrate, the epitaxial layer having a first surface distal from the semiconductor substrate and a second surface proximate to the semiconductor substrate; and,
   a resistor bridge disposed upon the semiconductor substrate, the resistor bridge comprising:
      a first set of resistive elements having a first vertical epitaxial resistor and a first lateral epitaxial resistor coupled in series, wherein the first vertical epitaxial resistor and the first lateral epitaxial resistor are disposed within the epitaxial layer; and
      a second set of resistive elements having a second vertical epitaxial resistor and a second lateral epitaxial resistor coupled in series, wherein the second vertical epitaxial resistor and the second lateral epitaxial resistor are disposed within the epitaxial layer,
   wherein the first set of resistive elements and the second set of resistive elements are coupled in parallel, and wherein the resistor bridge is operable to generate a differential signal responsive to a stress of the semiconductor substrate,
   wherein the first and second vertical epitaxial resistors each comprise:
      respective first and second pickups implanted upon and diffused into the first surface of the epitaxial layer; and
      a respective buried structure disposed under the first surface of the epitaxial layer,
   wherein a respective current passes from the respective first pickup, through a respective first region of the epitaxial layer, through the respective buried structure, and through a respective second region of the epitaxial layer to the respective second pickup.

2. The electronic circuit of claim 1, wherein each resistive element of the first and second sets of resistive elements have the same temperature coefficient.

3. The electronic circuit of claim 2, wherein a stress coefficient of the first vertical epitaxial resistor is equal to a stress coefficient of the second vertical epitaxial resistor.

4. The electronic circuit of claim 3, wherein a stress coefficient of the first lateral epitaxial resistors is equal to a stress coefficient of the second lateral epitaxial resistor.

5. The electronic circuit of claim 4, wherein stress coefficients of the first and second vertical epitaxial resistors are different from stress coefficients of the first and second lateral epitaxial resistors.

6. The electronic circuit of claim 5,
wherein each respective buried structure has a density of atoms that results in a respective first low resistance path with a respective first resistance lower than a resistance of the epitaxial layer, wherein the respective current passes through the respective first and second regions of the epitaxial layer in a direction substantially perpendicular to the first surface of the epitaxial layer, and wherein the respective buried structure has a respective first length dimension and a respective first width dimension, the respective first length dimension parallel to the respective first surface of the epitaxial layer.

7. The electronic circuit of claim 6, wherein the first and second lateral epitaxial resistors each comprise:
respective first and second pickups implanted upon and diffused into the first surface of the epitaxial layer, wherein a respective current passes from the first pickup, through a respective third region of the epitaxial layer, through a respective fourth region of the epitaxial layer, and through a respective fifth region of the epitaxial layer to the second pickup, wherein the respective current passes through the respective fourth region in a direction substantially parallel to the first surface of the epitaxial layer.

8. The electronic circuit of claim 7, further comprising a Hall effect element disposed upon the semiconductor substrate and proximate to the resistor bridge, wherein the resistor bridge is configured to sense a stress value of Hall effect element.

9. The electronic circuit of claim 8, further comprising a compensation circuit disposed upon the semiconductor substrate and coupled to the resistor bridge and operable to generate a compensation signal, wherein the compensation circuit is configured to receive the differential signal from the resistor bridge.

10. The electronic circuit of claim 9, further comprising an amplifier disposed upon the semiconductor substrate and coupled to the Hall effect element and the compensation circuit and operable to generate an amplified signal, wherein the amplifier is operable to change gain of the amplified signal depending upon a value of the compensation signal.

11. The electronic circuit of claim 8, further comprising:
an amplifier disposed upon the semiconductor substrate and coupled to the Hall effect element and operable to generate an amplified signal;
a first analog-to-digital converter disposed upon the semiconductor substrate and coupled to receive the amplified signal from the amplifier and operable to generate a first digital signal;
a processor disposed upon the semiconductor substrate and coupled to receive the first digital signal and operable to generate a processed signal wherein the processed single has a gain with respect to the first digital signal; and
a second analog-to-digital converter disposed upon the semiconductor substrate, coupled to the resistor bridge and operable to generate a second digital signal responsive to the differential signal, wherein the processor is further coupled to receive the second digital signal and operable to change the gain with respect to the first digital signal to generate the processed signal.

12. The electronic circuit of claim 9, further comprising:
a current generator operable to generate a drive current that passes through the Hall effect element, wherein the compensation circuit is coupled to the current generator and operable to provide the compensation signal to the current generator.

13. An electronic circuit comprising:
a semiconductor substrate;
an epitaxial layer disposed over a surface of the semiconductor substrate, the epitaxial layer having a first surface distal from the semiconductor substrate and a second surface proximate to the semiconductor substrate;
a Hall effect element comprising a bounded portion of the epitaxial layer; and
a resistor bridge disposed upon the semiconductor substrate and proximate to the Hall effect element, the resistor bridge comprising:
a first set of resistive elements having a first vertical epitaxial resistor and a first lateral epitaxial resistor coupled in series, wherein the first vertical epitaxial resistor and the first lateral epitaxial resistor are disposed within the epitaxial layer; and
a second set of resistive elements having a second vertical epitaxial resistor and a second lateral epitaxial resistor coupled in series, wherein the second vertical epitaxial resistor and the second lateral epitaxial resistor are disposed within the epitaxial layer,
wherein the first set of resistive elements and the second set of resistive elements are coupled in parallel, and wherein the resistor bridge is operable to sense a stress value of the semiconductor substrate and the Hall effect element, and wherein the resistor bridge is operable to generate a differential signal responsive to the stress value of the semiconductor substrate and the Hall effect element,
wherein the first and second vertical epitaxial resistors each comprise:
respective first and second pickups implanted upon and diffused into the first surface of the epitaxial layer; and
a respective buried structure disposed under the first surface of the epitaxial layer,
wherein a respective current passes from the respective first pickup, through a respective first region of the epitaxial layer, through the respective buried structure, and through a respective second region of the epitaxial layer to the respective second pickup.

14. The electronic circuit of claim 13, wherein each resistive element of the first and second sets of resistive elements have the same temperature coefficient.

15. The electronic circuit of claim 14, wherein a stress coefficient of the first vertical epitaxial resistor is equal to a stress coefficient of the second vertical epitaxial resistor.

16. The electronic circuit of claim 15, wherein a stress coefficient of the first lateral epitaxial resistors is equal to a stress coefficient of the second lateral epitaxial resistor.

17. The electronic circuit of claim 16, wherein stress coefficients of the first and second vertical epitaxial resistors are different from stress coefficients of the first and second lateral epitaxial resistors.

18. The electronic circuit of claim 13,
wherein each respective buried structure has a density of atoms that results in a respective first low resistance path with a respective first resistance lower than a resistance of the epitaxial layer, wherein the respective current passes through the respective first and second regions of the epitaxial layer in a direction substantially perpendicular to the first surface of the epitaxial layer, and wherein the respective buried structure has a respective first length dimension and a respective first width dimension, the respective first length dimension parallel to the respective first surface of the epitaxial layer.

19. The electronic circuit of claim 18, wherein the first and second lateral epitaxial resistors each comprise:
respective first and second pickups implanted upon and diffused into the first surface of the epitaxial layer, wherein a respective current passes from the first pickup, through a respective third region of the epitaxial layer, through a respective fourth region of the epitaxial layer, and through a respective fifth region of the epitaxial layer to the second pickup, wherein the respective current passes through the respective fourth region in a direction substantially parallel to the first surface of the epitaxial layer.

20. The electronic circuit of claim 19, further comprising a compensation circuit disposed upon the semiconductor substrate and coupled to the resistor bridge and operable to generate a compensation signal, wherein the compensation circuit is configured to receive the differential signal from the resistor bridge.

21. The electronic circuit of claim 20, further comprising an amplifier disposed upon the semiconductor substrate and coupled to the Hall effect element and the compensation circuit and operable to generate an amplified signal, wherein the amplifier is operable to change gain of the amplified signal depending upon a value of the compensation signal.

22. The electronic circuit of claim 19, further comprising:
an amplifier disposed upon the semiconductor substrate and coupled to the Hall effect element and the compensation circuit and operable to generate an amplified signal;
a first analog-to-digital converter disposed upon the semiconductor substrate and coupled to receive the amplified signal from the amplifier and operable to generate a first digital signal;
a processor disposed upon the semiconductor substrate and coupled to receive the first digital signal and operable to generate a processed signal wherein the processed single has a gain with respect to the first digital signal; and
a second analog-to-digital converter disposed upon the semiconductor substrate, coupled to the resistor bridge and operable to generate a second digital signal responsive to the differential signal, wherein the processor is further coupled to receive the second digital signal and operable to change the gain with respect to the first digital signal to generate the processed signal.

23. The electronic circuit of claim 20, further comprising:
a current generator operable to generate a drive current that passes through the Hall effect element, wherein the compensation circuit is coupled to the current generator and operable to provide the compensation signal to the current generator.

* * * * *

UNITED STATES PATENT AND TRADEMARK OFFICE
CERTIFICATE OF CORRECTION

PATENT NO. : 10,254,354 B2
APPLICATION NO. : 16/132653
DATED : April 9, 2019
INVENTOR(S) : Juan Manuel Cesaretti Page 1 of 1

It is certified that error appears in the above-identified patent and that said Letters Patent is hereby corrected as shown below:

In the Specification

Column 1, Line 34, delete "an" and replace with --to an--.

Column 3, Line 16, delete "of Hall" and replace with --of a Hall--.

Column 6, Line 47, delete "as" and replace with --is--.

Column 7, Line 14, delete "(i.e., ions)" and replace with --(i.e., ions).--.

Column 9, Line 9, delete "110 the" and replace with --110 are the--.

Column 9, Line 34, delete "and or swell" and replace with --and/or swell--.

Column 10, Line 2, delete "region 218," and replace with --region 216,--.

Column 11, Line 39, delete "324a, 324b, 324c, 324b" and replace with --324a, 324b, 324c, 324d--.

Column 11, Line 44, delete "324e, 324f, 324g, 324g" and replace with --324e, 324f, 324g, 324h--.

Column 13, Line 40, delete "-24.4×10-11" and replace with -- $-24.4 \times 10^{-11}$ --.

Column 15, Line 41, delete "signal 441" and replace with --signal 442--.

Column 16, Line 10, delete "temperature of" and replace with --temperature) of--.

Column 17, Line 52, delete "circuit 440" and replace with --circuit 441--.

Column 17, Line 60, delete "source 422" and replace with --source 423--.

Signed and Sealed this
Ninth Day of July, 2019

Andrei Iancu
*Director of the United States Patent and Trademark Office*